US012477804B2

(12) United States Patent
Zhu

(10) Patent No.: US 12,477,804 B2
(45) Date of Patent: Nov. 18, 2025

(54) NOR-TYPE STORAGE DEVICE, METHOD OF MANUFACTURING THE SAME, AND ELECTRONIC APPARATUS INCLUDING STORAGE DEVICE

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 927 days.

(21) Appl. No.: 17/653,774

(22) Filed: Mar. 7, 2022

(65) Prior Publication Data

US 2022/0285506 A1   Sep. 8, 2022

(30) Foreign Application Priority Data

Mar. 8, 2021   (CN) .......................... 202110253001.7

(51) Int. Cl.
*H10D 64/23*   (2025.01)
*H10B 43/10*   (2023.01)
(Continued)

(52) U.S. Cl.
CPC ........... *H10D 64/258* (2025.01); *H10B 43/10* (2023.02); *H10B 43/27* (2023.02); *H10B 51/10* (2023.02); *H10B 51/20* (2023.02); *H10D 30/0413* (2025.01); *H10D 30/0415* (2025.01); *H10D 30/693* (2025.01); *H10D 30/694* (2025.01);
(Continued)

(58) Field of Classification Search
CPC ............. H10D 64/258; H10D 30/0413; H10D 30/0415; H10D 30/693; H10D 30/694; H10D 30/701; H10D 62/151; H10D 64/033; H10D 64/037; H10D 64/689; H10B 43/10; H10B 43/27; H10B 51/10; H10B 51/20; H10B 43/20; H10B 43/30; H10B 51/30
See application file for complete search history.

(56) References Cited

U.S. PATENT DOCUMENTS 11,018,153 B2 *  5/2021  Kai .................. H10D 62/292
2017/0092370 A1 *  3/2017  Harari ............... H10D 64/037
(Continued)

*Primary Examiner* — Steven B Gauthier
*Assistant Examiner* — Khatib A Rahman
(74) *Attorney, Agent, or Firm* — Schwegman Lundberg & Woessner, P.A.

(57) ABSTRACT

A NOR-type storage device, a method of manufacturing the same, and an electronic apparatus including the same are provided. The NOR-type storage device includes: a gate stack extending vertically on a substrate; an active region surrounding a periphery of the gate stack, the active region including first and second source/drain regions, a first channel region between the first and second source/drain regions, third and fourth source/drain regions, and a second channel region between the third and fourth source/drain regions; first, second, third and fourth interconnection layers extending laterally from the first to fourth source/drain regions, respectively; and a source line contact part extending vertically with respect to the substrate to pass through the first to fourth interconnection layers and electrically connected to one of the first interconnection layer and the second interconnection layer, and to one of the third interconnection layer and the fourth interconnection layer.

20 Claims, 22 Drawing Sheets

(51) Int. Cl.
  *H10B 43/27* (2023.01)
  *H10B 51/10* (2023.01)
  *H10B 51/20* (2023.01)
  *H10D 30/01* (2025.01)
  *H10D 30/69* (2025.01)
  *H10D 62/13* (2025.01)
  *H10D 64/01* (2025.01)
  *H10D 64/68* (2025.01)

(52) U.S. Cl.
  CPC ......... *H10D 30/701* (2025.01); *H10D 62/151* (2025.01); *H10D 64/033* (2025.01); *H10D 64/037* (2025.01); *H10D 64/689* (2025.01)

(56) References Cited

U.S. PATENT DOCUMENTS

| | | | | |
|---|---|---|---|---|
| 2020/0035696 A1* | 1/2020 | Zhu | ........................ | H10B 43/50 |
| 2021/0050359 A1* | 2/2021 | Kai | ...................... | H10D 62/292 |
| 2021/0050360 A1* | 2/2021 | Kai | ........................ | G11C 5/063 |
| 2021/0202703 A1* | 7/2021 | Rajashekhar | .......... | H10B 43/27 |
| 2021/0242241 A1* | 8/2021 | Rajashekhar | .......... | H10B 41/10 |
| 2021/0375872 A1* | 12/2021 | Ahn | .................. | G11C 11/40611 |
| 2024/0090226 A1* | 3/2024 | Lai | ......................... | H10B 43/10 |

* cited by examiner

NOR-TYPE STORAGE DEVICE, METHOD OF MANUFACTURING THE SAME, AND ELECTRONIC APPARATUS INCLUDING STORAGE DEVICE

CROSS REFERENCE TO RELATED APPLICATION(S)

This application claims priority to Chinese Patent Application No. 202110253001.7, filed on Mar. 8, 2021, the entire contents of which are incorporated herein in their entireties by reference.

TECHNICAL FIELD

The present disclosure relates to a field of semiconductors, in particular to a NOR-type storage device, a method of manufacturing the same, and an electronic apparatus including such a storage device.

BACKGROUND

In a horizontal device such as a Metal Oxide Semiconductor Field Effect Transistor (MOSFET), a source electrode, a gate electrode, and a drain electrode are arranged in a direction substantially parallel to a substrate surface. Due to such an arrangement, it is difficult to further downsize the horizontal device. In contrast, in a vertical device, a source electrode, a gate electrode, and a drain electrode are arranged in a direction substantially perpendicular to a substrate surface. Therefore, different from the horizontal device, the vertical device may be easier downsized or vertically stacked, which is convenient to improve an integration density, especially an integration density per unit area.

Vertical devices may be stacked to increase the integration density. However, this may result in a poor performance. For the convenience of stacking a plurality of devices, polysilicon is generally used as a channel material, which may result in an increase in resistance compared to a channel material of a single crystal silicon. In addition, when a contact part to a plurality of stacked devices is fabricated, a large area may be occupied. For example, an increase in the number of device stacks may cause an increase in the number of contact parts or in the occupied area.

SUMMARY

According to an aspect of the present disclosure, a vertical storage device is provided, including: a gate stack extending vertically on a substrate, wherein the gate stack includes a gate conductor layer and a storage function layer; an active region surrounding a periphery of the gate stack, wherein the active region includes a first source/drain region and a second source/drain region respectively located at different heights with respect to the substrate and a first channel region located between the first source/drain region and the second source/drain region in a vertical direction, the active region further includes a third source/drain region and a fourth source/drain region respectively located at different heights with respect to the substrate and a second channel region located between the third source/drain region and the fourth source/drain region in the vertical direction, the storage function layer is arranged between the gate conductor layer and the active region, a first storage cell is defined at an intersection of the gate stack with the first source/drain region, the first channel region and the second source/drain region, and a second storage cell is defined at an intersection of the gate stack with the third source/drain region, the second channel region and the fourth source/drain region; a first interconnection layer, a second interconnection layer, a third interconnection layer, and a fourth interconnection layer extending laterally from the first source/drain region, the second source/drain region, the third source/drain region, and the fourth source/drain region, respectively; and a source line contact part extending vertically with respect to the substrate to pass through the first interconnection layer, the second interconnection layer, the third interconnection layer, and the fourth interconnection layer, wherein the source line contact part is electrically connected to one of the first interconnection layer and the second interconnection layer and electrically connected to one of the third interconnection layer and the fourth interconnection layer.

According to another aspect of the present disclosure, a method of manufacturing a vertical storage device is provided, including: providing a plurality of device layers on a substrate including a source line contact region and a device region, wherein each device layer of the plurality of device layers includes a stack of a first source/drain defining layer, a first channel defining layer and a second source/drain defining layer; forming a processing channel extending vertically with respect to the substrate to pass through the stack in each device layer; forming a gate stack in a processing channel of the device region, wherein the gate stack includes a gate conductor layer and a storage function layer arranged between the gate conductor layer and the stack; laterally recessing the first source/drain defining layer relative to the second source/drain defining layer in the source line contact region via the processing channel; forming a sidewall isolation layer on a sidewall of the first source/drain defining layer, wherein the sidewall isolation layer exposes a sidewall of the second source/drain defining layer; and forming a source line contact part in a processing channel in the source line contact region.

According to another aspect of the present disclosure, an electronic apparatus is provided, including the NOR-type storage device described above.

BRIEF DESCRIPTION OF THE DRAWINGS

The above and other objectives, features and advantages of the present disclosure will be more apparent through the following description of embodiments of the present disclosure with reference to the accompanying drawings, in which:

FIG. 1 to FIG. 14(b) show schematic diagrams of some stages in a process of manufacturing a NOR-type storage device according to an embodiment of the present disclosure;

FIG. 27 to FIG. 38 show schematic diagrams of some stages in a process of manufacturing a NOR-type storage device according to another embodiment of the present disclosure;

FIG. 2(a) shows a position of line AA' and a position of line BB', FIG. 1, FIG. 2(b), FIG. 3 to FIG. 13, FIG. 14(a), FIG. 15 to FIG. 33, FIG. 34(b) and FIG. 35 to FIG. 38 show cross-sectional views taken along the line AA', and FIG. 14(b) shows a cross-sectional view taken along the line BB'.

Throughout the accompanying drawings, the same or similar reference numerals indicate the same or similar components.

DETAILED DESCRIPTION OF EMBODIMENTS

Figure 1:
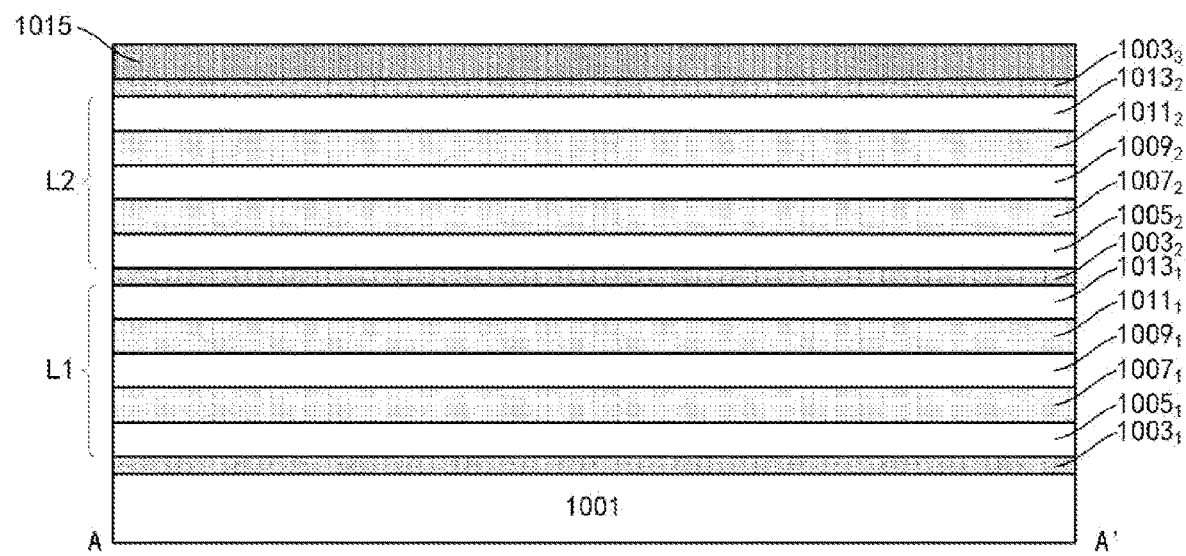

Embodiments of the present disclosure will be described below with reference to the accompanying drawings. It should be understood, however, that these descriptions are merely exemplary and are not intended to limit the scope of the present disclosure. In addition, in the following description, descriptions of well-known structures and technologies are omitted to avoid unnecessarily obscuring the concepts of the present disclosure.

Various schematic structural diagrams according to the embodiments of the present disclosure are shown in the accompanying drawings. The figures are not drawn to scale. Some details are enlarged and some details may be omitted for clarity of presentation. The shapes of the various regions and layers as well as the relative size and positional relationship thereof shown in the figures are only exemplary. In practice, there may be deviations due to manufacturing tolerances or technical limitations, and those skilled in the art may additionally design regions/layers with different shapes, sizes and relative positions according to actual needs.

In the context of the present disclosure, when a layer/element is referred to as being located "on" another layer/element, the layer/element may be located directly on the another layer/element, or there may be an intermediate layer/element between them. In addition, if a layer/element is located "on" another layer/element in one orientation, the layer/element may be located "under" the another layer/element when the orientation is reversed.

A storage device according to the embodiments of the present disclosure is based on a vertical type device. The vertical type device may include an active region arranged on a substrate in a vertical direction (a direction substantially perpendicular to a substrate surface), and the active region may include source/drain regions arranged at upper and lower ends and a channel region located between the source/drain regions. A conductive channel may be formed between the source/drain regions through the channel region. In the active region, the source/drain regions and the channel region may be defined by, for example, a doping concentration.

According to the embodiments of the present disclosure, the active region may be defined by a stack of a first source/drain defining layer, a first channel defining layer and a second source/drain defining layer on the substrate. The source/drain regions may be formed in the first source/drain defining layer and the second source/drain defining layer, respectively, and the channel region may be formed in the first channel defining layer. A gate stack may extend through the stack, so that the active region may surround a periphery of the gate stack. The gate stack may include a storage function layer such as at least one of a charge trapping material or a ferroelectric material, so as to achieve a storage function. In this way, the gate stack may cooperate with an opposing active region to define a storage cell. The storage cell may be a flash memory cell.

A plurality of gate stacks may be arranged to pass through the stack so as to define a plurality of storage cells at an intersection of the plurality of gate stacks with the stack. The plurality of storage cells may be arranged in an array (e.g., generally a two-dimensional array arranged in rows and columns) corresponding to the plurality of gate stacks on a plane where the stack is located.

Due to a characteristic of easy stacking of the vertical type device, the storage device according to the embodiments of the present disclosure may be a three-dimensional (3D) array. Specifically, a plurality of such stacks may be arranged in the vertical direction. The gate stack may extend vertically to pass through the plurality of stacks. In this way, a single gate stack may intersect with the plurality of stacks arranged in the vertical direction so as to define a plurality of storage cells stacked in the vertical direction.

In a NOR-type storage device, each storage cell may be connected to a common source line. In view of such configuration, in order to save wiring, two storage cells adjacent in the vertical direction may share a source line connection. For example, the above-mentioned stack may further include a second channel defining layer and a third source/drain defining layer. The first source/drain defining layer, the first channel defining layer and the second source/drain defining layer may cooperate with the gate stack as described above to define a first storage cell, and the second source/drain defining layer, the second channel defining layer and the third source/drain defining layer may cooperate with the gate stack to define a second storage cell. The first storage cell and the second storage cell may be stacked and share a second source/drain defining layer that may be electrically connected to the source line.

The above-mentioned stack may be formed by an epitaxial growth on the substrate, and may include a single crystal semiconductor material. Different from a conventional process of forming a plurality of gate stacks stacked on each other and then forming a vertical active region passing through the gate stacks, it is easier to form a single crystalline active region (especially a channel defining layer). In addition, each layer in the stack may be doped in situ while being grown, and a doping concentration interface may exist between different doped layers. In this way, a doping distribution in the vertical direction may be controlled better. The stack of the first source/drain defining layer, the channel defining layer and the second source/drain defining layer may constitute a bulk material, and thus the channel region is formed in the bulk material. In this case, the process is simple.

According to the embodiments of the present disclosure, the storage cells at different heights in the vertical direction may share a common source line contact part. The source line contact part may extend vertically to pass through each device layer and may be electrically connected to the source/drain defining layer corresponding to a source region in each device layer (e.g., by contacting with each other).

Such a vertical type storage device may be manufactured, for example, as follows. Specifically, a plurality of device layers may be provided on a substrate, and each device layer may include a stack of a first source/drain defining layer, a first channel defining layer, and a second source/drain defining layer (and optionally the second channel defining layer and the third source/drain defining layer as described above). These layers may be provided, for example, by an epitaxial growth. During the epitaxial growth, a thickness of each grown layer, especially the channel defining layer, may be controlled. In addition, an in-situ doping may be performed during the epitaxial growth, so as to achieve a desired doping polarity and a desired doping concentration. Each layer in the stack may include the same material. In this case, the so-called "layers" may be defined by a doping concentration interface between the layers.

A sacrificial layer may be formed between at least some of or even all of adjacent device layers. Such a sacrificial layer may be then replaced with an isolation layer to electrically isolate adjacent bit lines. The sacrificial layer may have an etching selectivity relative to the device layer.

A processing channel extending vertically with respect to the substrate may be formed to pass through the stack in each device layer. A sidewall of the sacrificial layer may be exposed in the processing channel, so that the sacrificial layer may be replaced by the isolation layer. A gate stack may be formed in the processing channel.

In addition, in the source line contact region, a source line contact part may be formed in the processing channel. In order to avoid an undesired electrical connection between the source line contact part and the source/drain defining layer serving as a drain region, the source/drain defining layer serving as the drain region may be laterally recessed relative to the source/drain defining layer serving as the source region via the processing channel, and a sidewall isolation layer may be formed in such a recess.

The present disclosure may be presented in various forms, some examples of which will be described below. In the following description, a selection of various materials is involved. In the selection of materials, in addition to functions of the materials (for example, a semiconductor material may be used to form the active region, a dielectric material may be used to form an electrical isolation, and a conductive material may be used to form an electrode, an interconnection structure, etc.), an etching selectivity is also considered. In the following description, a required etching selectivity may or may not be indicated. It should be clear to those skilled in the art that when etching a material layer is mentioned below, if it is not mentioned or shown that other layers are also etched, then the etching may be selective, and the material layer may have an etching selectivity relative to other layers exposed to the same etching formula.

FIG. 1 to FIG. 14(b) show schematic diagrams of some stages in a process of manufacturing a NOR-type storage device according to the embodiments of the present disclosure.

As shown in FIG. 1, a substrate 1001 is provided. The substrate 1001 may be in various forms, including but not limited to a bulk semiconductor material substrate such as a bulk Si substrate, a semiconductor-on-insulator (SOI) substrate, a compound semiconductor substrate such as a SiGe substrate, and the like. In the following description, for convenience of explanation, a bulk Si substrate such as a Si wafer is taken as an example for description.

A storage device, such as a NOR-type flash memory, may be formed on the substrate 1001 as follows. A storage cell in the storage device may be an n-type device or a p-type device. An n-type storage cell is taken as an example for description. Accordingly, a p-type well may be formed in the substrate 1001. Thus, the following description, especially the description about a doping type, is directed to a formation of an n-type device. However, the present disclosure is not limited to this.

A sacrificial layer $1003_1$ for defining an isolation layer, a first source/drain defining layer $1005_1$ for defining a source/drain region, a first channel defining layer $1007_1$ for defining a channel region, a second source/drain defining layer $1009_1$ for defining a source/drain region, a second channel defining layer $1011_1$ for defining a channel region, and a third source/drain defining layer $1013_1$ for defining a source/drain region may be formed on the substrate 1001 by, for example, an epitaxial growth. The first source/drain defining layer $1005_1$, the first channel defining layer $1007_1$, the second source/drain defining layer $1009_1$, the second channel defining layer $1011_1$, and the third source/drain defining layer $1013_1$ may then define an active region of the device, and may be referred to as a "device layer", which is denoted by L1 in figure.

Each layer grown on the substrate 1001 may be a single crystalline semiconductor layer. Because the layers are grown or doped separately, a crystal interface or a doping concentration interface may exist between these layers.

The sacrificial layer $1003_1$ may then be replaced by an isolation layer for isolating the device from the substrate, and a thickness of the sacrificial layer may correspond to a desired thickness of the isolation layer, for example, in a range of about 10 nm to 50 nm. According to a circuit design, the sacrificial layer $1003_1$ may not be provided. The first source/drain defining layer $1005_1$, the second source/drain defining layer $1009_1$, and the third source/drain defining layer $1013_1$ may be doped (e.g., doped in situ while being grown) to form a source/drain region with a thickness, for example, in a range of about 20 nm to 50 nm. The first channel defining layer $1007_1$ and the second channel defining layer $1011_1$ may define a gate length, and may have a thickness corresponding to a desired gate length, for example, in a range of about 15 nm to 100 nm.

These semiconductor layers may include various suitable semiconductor materials, for example, an elemental semiconductor material such as Si or Ge, or a compound semiconductor material such as SiGe, and the like. Considering the following process of replacing the sacrificial layer $1003_1$ with an isolation layer, the sacrificial layer $1003_1$ may have an etching selectivity relative to the device layer. For example, the sacrificial layer $1003_1$ may include SiGe (in which an atomic percentage of Ge may be, for example, in a range of about 15% to 30%), and the device layer may include Si. In this example, the source/drain defining layer and the channel defining layer in the device layer both include Si. However, the present disclosure is not limited thereto. For example, adjacent layers in the device layer may also have etching selectivity.

The first source/drain defining layer $1005_1$, the second source/drain defining layer $1009_1$, and the third source/drain defining layer $1013_1$ may be doped in situ while being grown, so as to subsequently form the source/drain region. For example, for an n-type device, an n-type doping may be performed, and a doping concentration may be, for example, in a range of about $1E19$ $cm^{-3}$ to $1E21$ $cm^{-3}$. In addition, the first channel defining layer $1007_1$ and the second channel defining layer $1011_1$ may not be intentionally doped or may be lightly doped by in-situ doping while being grown, so as to improve a short channel effect, adjust a device threshold voltage ($V_t$), and so on. For example, for an n-type device, a p-type doping may be performed, and a doping concentration may be, for example, in range of about $1E17$ $cm^{-3}$ to $1E19$ $cm^{-3}$.

In order to increase an integration density, a plurality of device layers may be provided. For example, a device layer L2 may be arranged on the device layer L1 by an epitaxial growth, and the device layers may be separated from each other by a sacrificial layer $1003_2$ for defining an isolation layer. Only two device layers are shown in FIG. 1, but the present disclosure is not limited thereto. According to a circuit design, the isolation layer may not be provided between some device layers. Similarly, the device layer L2 may include a first source/drain defining layer $1005_2$, a first channel defining layer $1007_2$, a second source/drain defining layer $1009_2$, a second channel defining layer $1011_2$, and a third source/drain defining layer $1013_2$. Corresponding layers in respective device layers may have the same or similar thickness and/or material, or may have different thickness and/or material. For ease of description only, it is assumed that the device layers L1 and L2 have the same configuration.

For convenience of patterning, a hard mask layer 1015 may be provided on the layers formed on the substrate 1001. For example, the hard mask layer 1015 may include a nitride (e.g., silicon nitride) and have a thickness in a range of about 50 nm to 200 nm.

A sacrificial layer $1003_3$ for defining an isolation layer may be also arranged between the hard mask layer 1015 and the device layer L2. As for the sacrificial layers $1003_2$ and $1003_3$, reference may be made to the above description of the sacrificial layer $1003_1$.

In the following, on one hand, a processing channel that may reach the sacrificial layer is required so that the sacrificial layer may be replaced with an isolating layer; and on the other hand, it is necessary to define a region for forming a gate. According to the embodiments of the present disclosure, the two may be performed in combination. Specifically, a gate region may be defined using a processing channel.

Figure 2A:
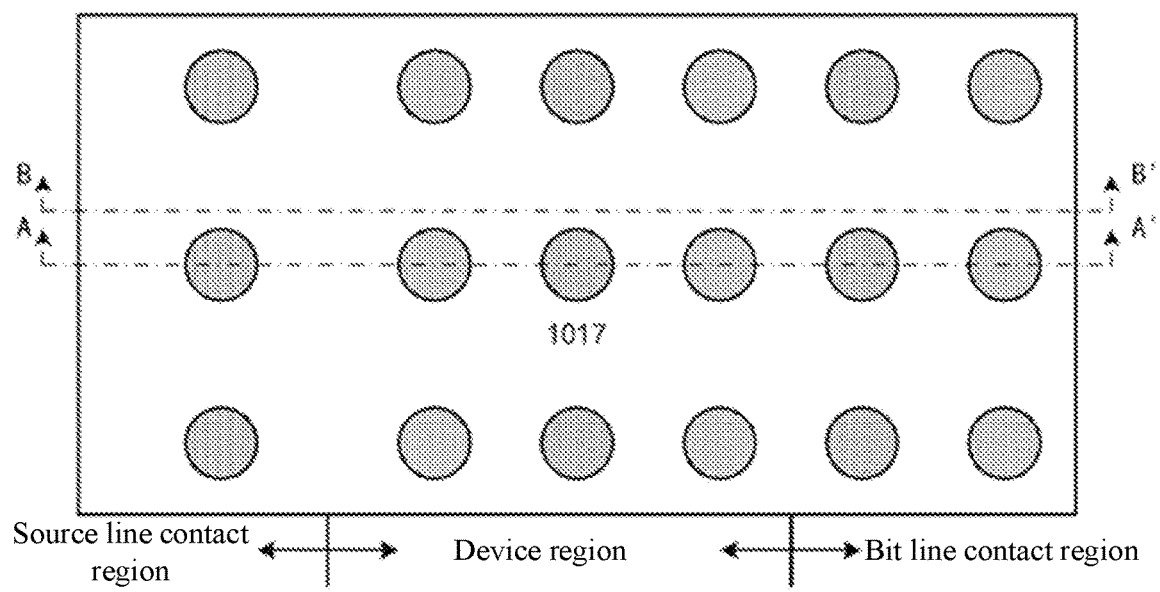
FIG. 2(a) and FIG. 34(a) show top views.
Figure 2B:
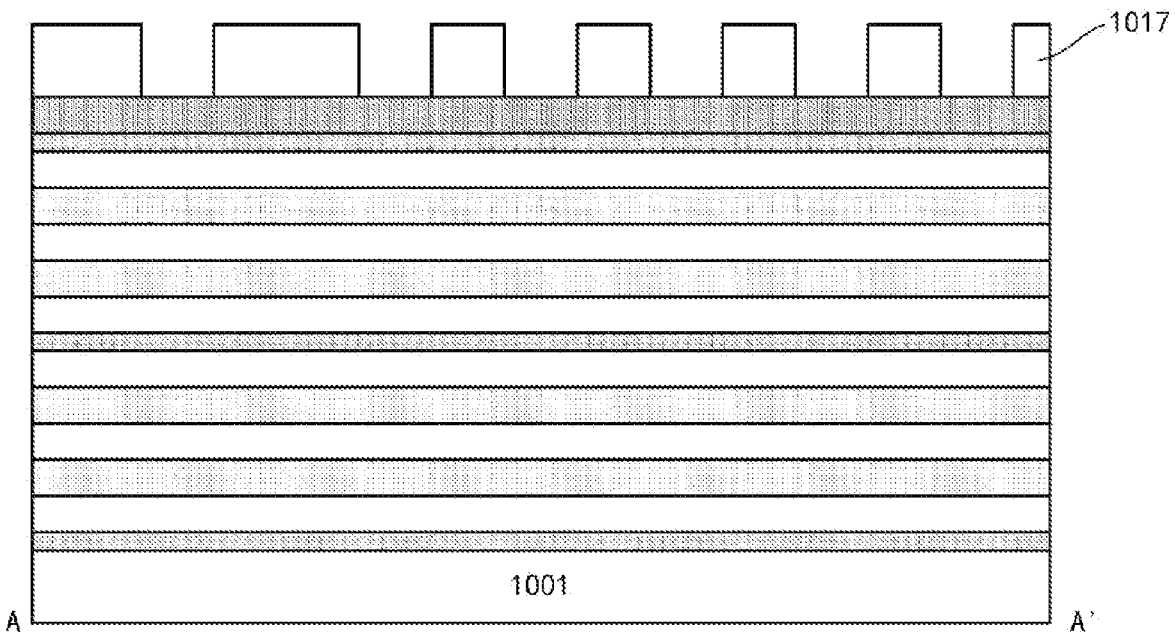

For example, as shown in FIG. 2(*a*) and FIG. 2(*b*), a photoresist 1017 may be formed on the hard mask layer 1015 and may be patterned by photolithography to have a series of openings that may define a position of the processing channel. The openings may be of various suitable shapes, such as circle, rectangle, square, polygon, etc., and may have a suitable size, such as a diameter or a side length in a range of about 20 nm to 500 nm. These openings may be arranged in a form of an array (especially in the device region), for example, a two-dimensional array in a horizontal direction and a vertical direction on a paper plane in FIG. 2(*a*). The array may then define an array of storage cells. FIG. 2(*a*) shows openings formed on the substrate (which includes a device region for subsequently fabricating the storage cell and a contact region for subsequently fabricating a contact part, and the contact region may further include a source line contact region for fabricating a source line contact part and a bit line contact region for fabricating a bit line contact part) with a substantially uniform size and a substantially uniform density, but the present disclosure is not limited thereto. The size and/or density of the openings may be changed. For example, a density of openings in the contact region may be less than a density of openings in the device region, so as to reduce a resistance in the contact region.

In FIG. 2(*a*), the source line contact region and the bit line contact region are located on opposite sides of the device region. However, the present disclosure is not limited to this. A layout may be changed according to the circuit design.

Figure 3:
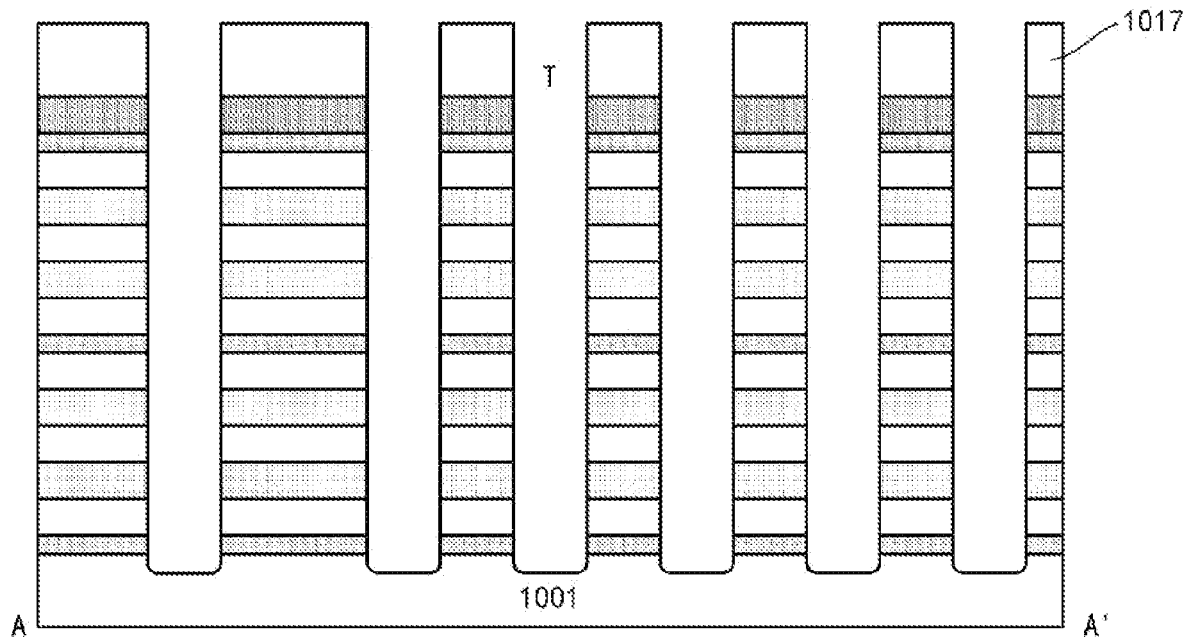

As shown in FIG. 3, the layers on the substrate 1001 may be etched by an anisotropic etching such as Reactive Ion Etching (ME) using the photoresist 1017 patterned in such manner as an etching mask, so as to form a processing channel T. The RIE may be performed in a substantially vertical direction (e.g., a direction perpendicular to the substrate surface) and may be performed into the substrate 1001. And thus, a series of vertical processing channels T may be formed on the substrate 1001. The processing channels T in the device region may also define a gate region. After that, the photoresist 1017 may be removed.

A sidewall of the sacrificial layer is exposed in the processing channel T. The sacrificial layer may be then replaced with an isolation layer via the exposed sidewall. Considering a support function for the device layers L1 and L2 during replacement, a support layer may be formed.

Figure 4:
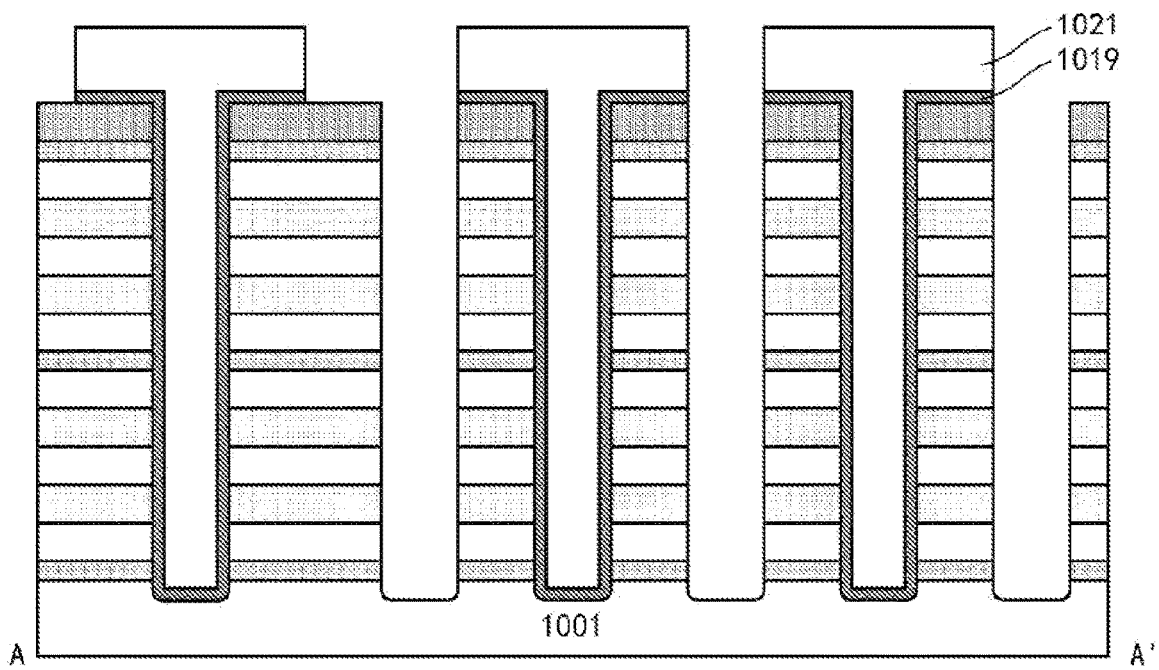

For example, as shown in FIG. 4, a support material layer may be formed on the substrate 1001 by, for example, a deposition such as Chemical Vapor Deposition (CVD). The support material layer may be formed in a substantially conformal manner. Considering the etching selectivity, especially the etching selectivity relative to the hard mask layer 1015 (a nitride in this example) and the subsequently formed isolation layer (an oxide in this example), the support material layer may include, for example, SiC. By forming a photoresist 1021 and performing a selective etching such as RIE in cooperation with the photoresist 1021, for example, a support material layer in some processing channels T may be removed and a support material layer in the other processing channels T may be left. The left support material layer may form a support layer 1019. In this way, on one hand, the sacrificial layer may be replaced through the processing channel in which the support layer 1019 is not formed, and on the other hand, the device layers L1 and L2 may be supported by the support layer 1019 in the other processing channels. After that, the photoresist 1021 may be removed.

An arrangement of the processing channel in which the support layer 1019 is formed and the processing channel in which the support layer 1019 is not formed may be achieved by the patterning of the photoresist 1021, and the processing channels may be distributed substantially uniformly for process consistency and uniformity. As shown in FIG. 4, the processing channel in which the support layer 1019 is formed and the processing channel in which the support layer 1019 is not formed may be arranged alternately.

Figure 5:
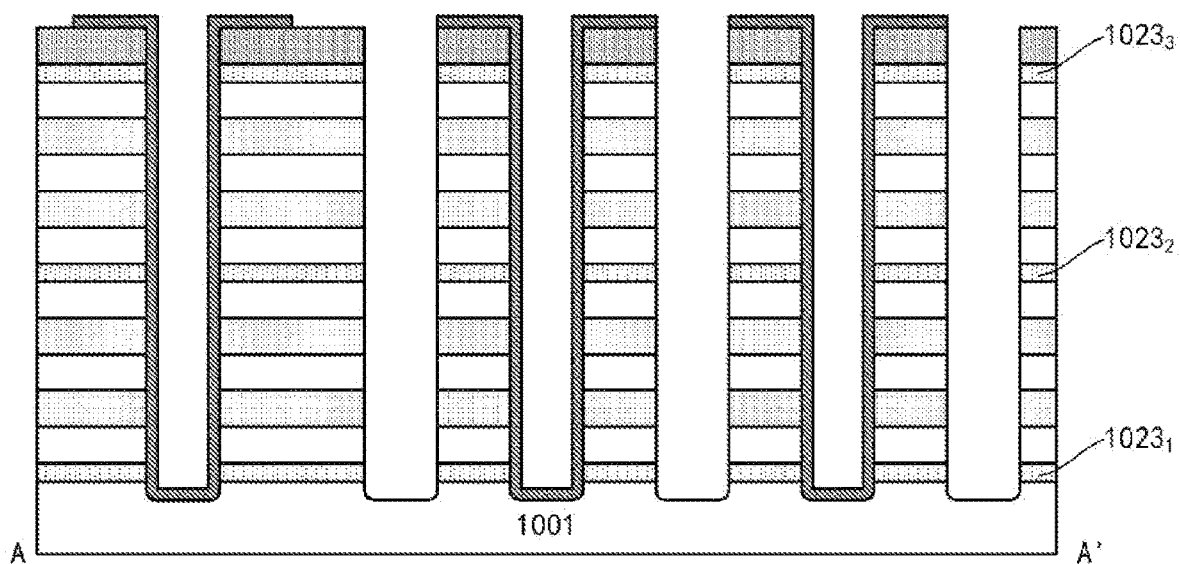

Then, as shown in FIG. 5, the sacrificial layers $1003_1$, $1003_2$ and $1003_3$ may be removed by a selective etching via the processing channel T. Due to an existence of the support layer 1019, the device layers L1 and L2 may be kept from collapsing. In a gap left by a removal of the sacrificial layer, a dielectric material may be filled by, for example, a process of depositing (e.g., Atomic Layer Deposition (ALD) to better control a film thickness) and then etching back (e.g., RIE in the vertical direction), so as to form isolation layers $1023_1$, $1023_2$ and $1023_3$. A suitable dielectric material, such as oxide, nitride, SiC or a combination thereof, may be selected for various purposes, such as optimizing isolation reliability, leakage current or capacitance, etc. Considering the etching selectivity, the isolation layers $1023_1$, $1023_2$ and $1023_3$ may include an oxide (e.g., silicon oxide).

After that, the support layer 1019 may be removed by a selective etching.

A gate stack may be formed in the processing channel, especially in the processing channel in the device region. In order to form a storage device, a storage function may be achieved by the gate stack. For example, the gate stack may include a storage structure, such as a charge trapping material or a ferroelectric material.

Figure 6:
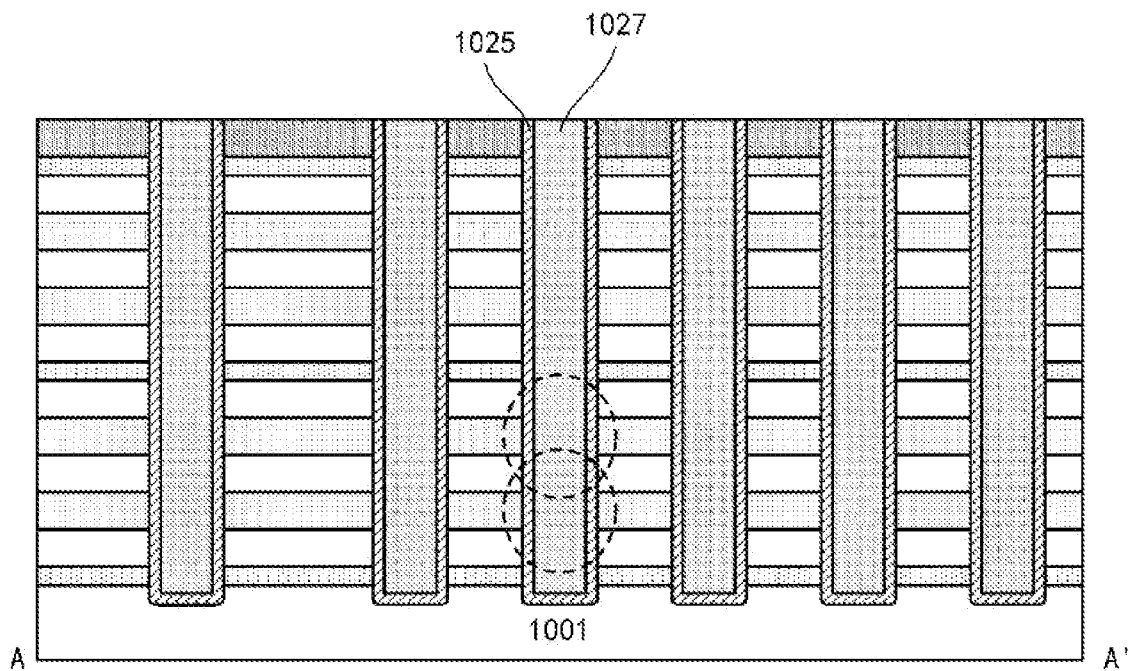

As shown in FIG. 6, a storage function layer 1025 and a gate conductor layer 1027 may be formed sequentially, for example, by a deposition. The storage function layer 1025 may be formed in a substantially conformal manner, and the gate conductor layer 1027 may fill a gap left in the processing channel T after the storage function layer 1025 is formed. A planarization process such as chemical mechanical polishing (CMP) may be performed on the gate conductor layer 1027 and the storage function layer 1025 (the CMP may stop at the hard mask layer 1015, for example), so that the gate conductor layer 1027 and the storage function layer 1025 may be left in the processing channel T to form a gate stack.

The storage function layer 1025 may be based on a dielectric charge trapping, a ferroelectric material effect, or a band gap engineered charge storage (SONOS), etc. For example, the storage function layer 1025 may include a dielectric tunneling layer (e.g., an oxide with a thickness in a range of about 1 nm to 5 nm, which may be formed by an oxidation or ALD), a band-offset layer (e.g., a nitride with a thickness in a range of about 2 nm to 10 nm, which may be formed by CVD or ALD), and an isolation layer (e.g., an oxide with a thickness in a range of about 2 nm to 6 nm, which may be formed by an oxidation, CVD or ALD). Such a three-layer structure may result in a band structure that may trap electrons or holes. Alternatively, the storage function layer 1025 may include a ferroelectric material layer, such as $HfZrO_2$ with a thickness in a range of about 2 nm to 20 nm.

The gate conductor layer 1027 may include, for example, a (doped, e.g., p-type doped in a case of an n-type device) polysilicon or a metal gate material.

As shown in FIG. 6, the gate stack (1025/1027) including the storage function layer is surrounded by the active region. The gate stack may cooperate with the active region (the stack of the source/drain defining layer, the channel defining layer and the source/drain defining layer) to define a storage cell, as shown by a dashed circle in FIG. 6. The channel region formed in the channel defining layer may connect source/drain regions formed in the source/drain defining layers at opposite ends, and the channel region may be controlled by the gate stack.

The gate stack may extend in a pillar shape in the vertical direction and overlap a plurality of device layers, so as to define a plurality of storage cells stacked in the vertical direction. The storage cells associated with a single gate stack pillar may form a storage cell string. Corresponding to an arrangement of the gate stack pillar (corresponding to the arrangement of the processing channel T described above, e.g., a two-dimensional array), a plurality of such storage cell strings are arranged on the substrate to form a three-dimensional (3D) array of storage cells.

In this embodiment, a single gate stack pillar may define two storage cells in a single device layer, as shown by two dashed circles in the device layer L1 shown in FIG. 6. In the NOR-type storage device, these two storage cells may share a source/drain defining layer (the second source/drain defining layer $1009_1$ or $1009_2$ in the middle), and may be electrically connected to a source line. In addition, these two storage cells may be electrically connected to a bit line through the source/drain defining layers (the first source/drain defining layer $1005_1$ or $1005_2$ and the third source/drain defining layer $1013_1$ or $1013_2$) at the upper and lower sides, respectively.

In this way, the storage cell (in the device region) may be fabricated. Then, various electrical contact parts may be fabricated (in the contact region) to achieve a desired electrical connection.

Hereinafter, a formation of the source line contact part in the source line contact region is discussed.

In the NOR-type storage device, one source/drain region (i.e., the source region) of each storage cell may be electrically connected to a common source line, and the other source/drain region (i.e., the drain region) may be connected to a bit line. It is noted that the processing channel may penetrate each device layer in the vertical direction and may thus reach each source/drain defining layer (in which the source/drain region is formed) in the device layer. Therefore, the source line contact part that may reach the source region in each device layer may be fabricated in the processing channel (in the source line contact region), so as to reduce the number of source line connections and thereby saving area.

Figure 7:
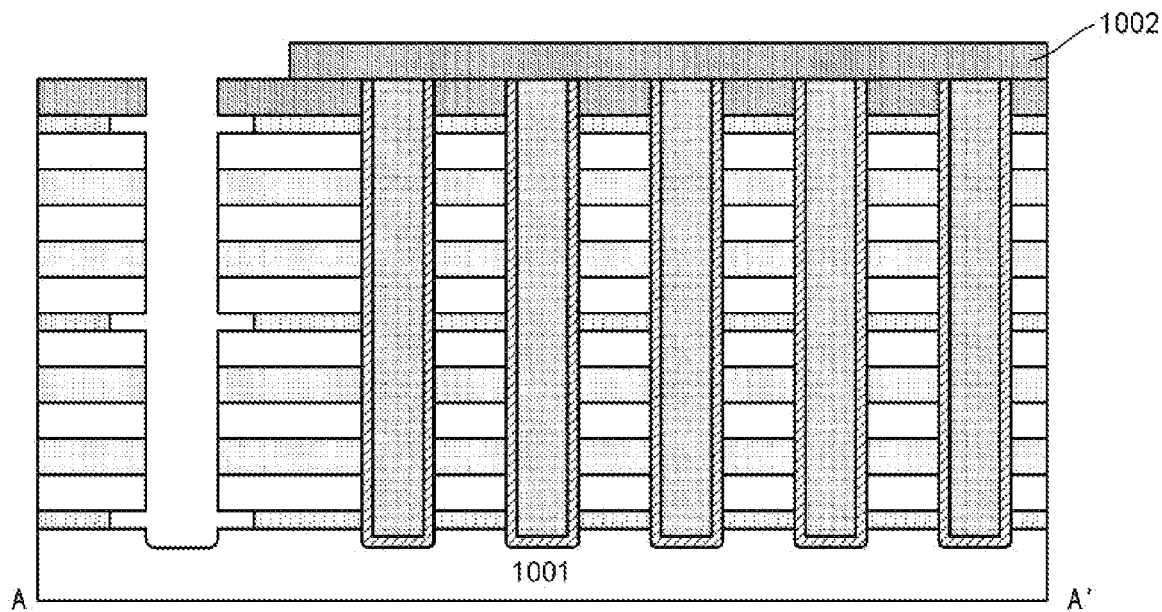

The gate stack is formed in the processing channel. The gate stack in the processing channel in the source line contact region may be removed. For example, as shown in FIG. 7, a shielding layer 1002 may be formed on the hard mask layer 1015 and may be patterned to expose the source line contact region while shielding other regions such as the device region and the bit line contact region. Considering the etching selectivity, the shielding layer 1002 may include a nitride. Then, the gate stack in the source line contact region may be removed by a selective etching, so that the processing channel is exposed again.

The first source/drain defining layer and the third source/drain defining layer (corresponding to the drain region, which is to be electrically connected to the bit line) in each device layer and the second source/drain defining layer (corresponding to the source region, which is to be electrically connected to the common source line) in the device layer have substantially coplanar sidewalls in the exposed processing channel. In order to prevent the source line contact part subsequently formed in the processing channel contacting the first source/drain defining layer and the third source/drain defining layer while contacting the second source/drain defining layer, the first source/drain defining layer and the third source/drain defining layer may be laterally recessed relative to the second source/drain defining layer. In a case that the first source/drain defining layer and the third source/drain defining layer have an etching selectivity relative to the second source/drain defining layer, such a relative recessing in a lateral direction may be achieved by selectively etching the first source/drain defining layer and the third source/drain defining layer via the processing channel.

In this example, since each source/drain defining layer in the device layer includes the same material and substantially the same doping, it is difficult to achieve the relative recessing in the lateral direction by only a lateral etching via the processing channel. In order to etch the first source/drain defining layer and the third source/drain defining layer more than the second source/drain defining layer, the first source/drain defining layer and the third source/drain defining layer may be exposed more.

For example, as shown in FIG. 7, the isolation layers $1023_1$, $1023_2$ and $1023_3$ may be recessed laterally by a depth through a selective etching via the processing channel. Then, not only the sidewall of the first source/drain defining layer and the sidewall of the third source/drain defining layer are exposed in the processing channel, but also a lower surface of the first source/drain defining layer and an upper surface of the third source/drain defining layer are partially exposed. In contrast, only the sidewall of the second source/drain defining layer is exposed in the processing channel. Then, the first source/drain defining layer and the third source/drain defining layer may be etched faster than the second source/drain defining layer even with the same etching formula. A recessing depth of the isolation layers $1023_1$, $1023_2$ and $1023_3$ in the lateral direction may be not less than, for example, approximately equal to the thickness of each source/drain defining layer, so as to avoid that a lateral etching of the first source/drain defining layer and the third source/drain defining layer is dominant over the etching from the upper or lower surface, which is not conductive to a formation of the above-mentioned relative recesses in the lateral direction.

Figure 8:
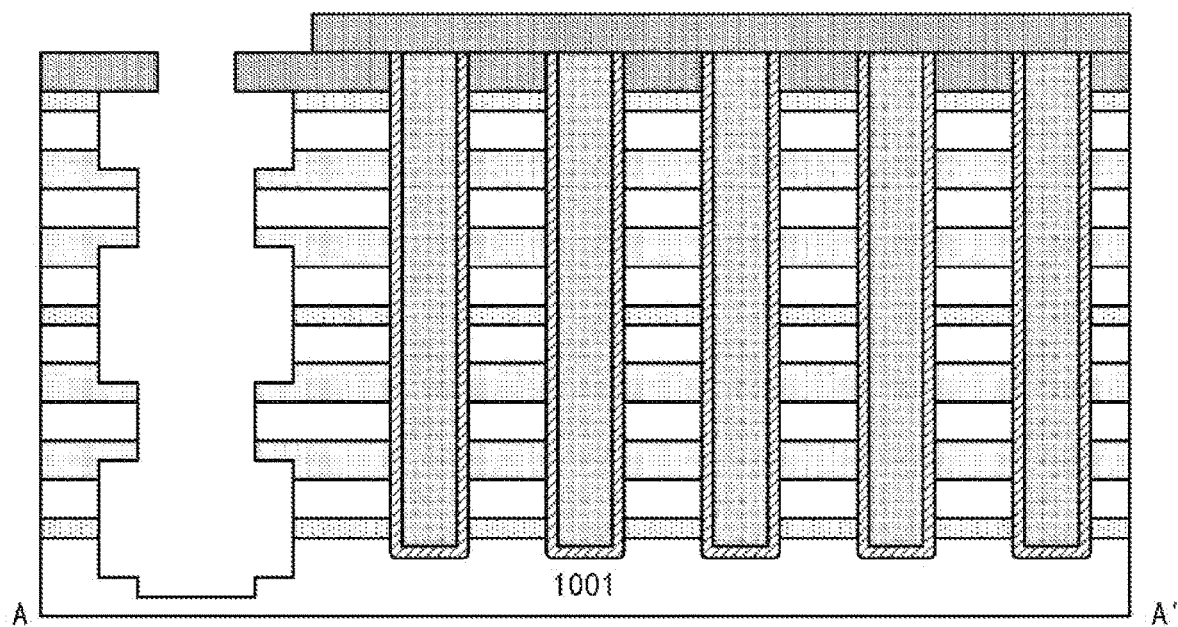
Figure 39:
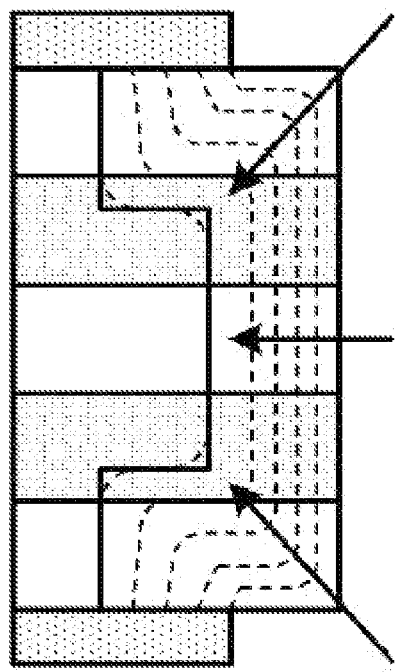
FIG. 39 schematically shows an etching of a device layer.

Then, as shown in FIG. 8, the first source/drain defining layer and the third source/drain defining layer may be selectively etched. As described above, in this example, the second source/drain defining layer may also be etched during etching the first source/drain defining layer and the third source/drain defining layer. However, since an area of the first source/drain defining layer and an area of the third source/drain defining layer subjected to the etching formula is greater than that of the second source/drain defining layer subjected to the etching formula, an etching rate for the first source/drain defining layer and an etching rate for the third source/drain defining layer may be greater than an etching rate for the second source/drain defining layer, so that the above-mentioned relative recessing in the lateral direction may be formed. FIG. 39 schematically shows such an etching process. Specifically, arrows shown indicate etching directions, and dotted lines shown schematically indicate etched surfaces over time. In order to ensure the relative recessing of the first source/drain defining layer and the third source/drain defining layer in the lateral direction, the etching needs to reach or even enter the channel defining layer in the vertical direction. For convenience of illustration only, the etched surfaces are shown as flat, and two surfaces are substantially orthogonal to each other. However, the present disclosure is not limited to this.

In addition, the isolation layers $1023_1$, $1023_2$ and $1023_3$ may be further recessed laterally through a selective etching so that their sidewalls do not exceed the sidewalls of the adjacent first source/drain defining layer and third source/drain defining layer in the lateral direction, so as to avoid affecting a subsequent formation of a sidewall isolation layer for covering the sidewall of the first source/drain defining layer and the sidewall of the third source/drain defining layer.

Next, the sidewall isolation layer may be formed.

Figure 9:
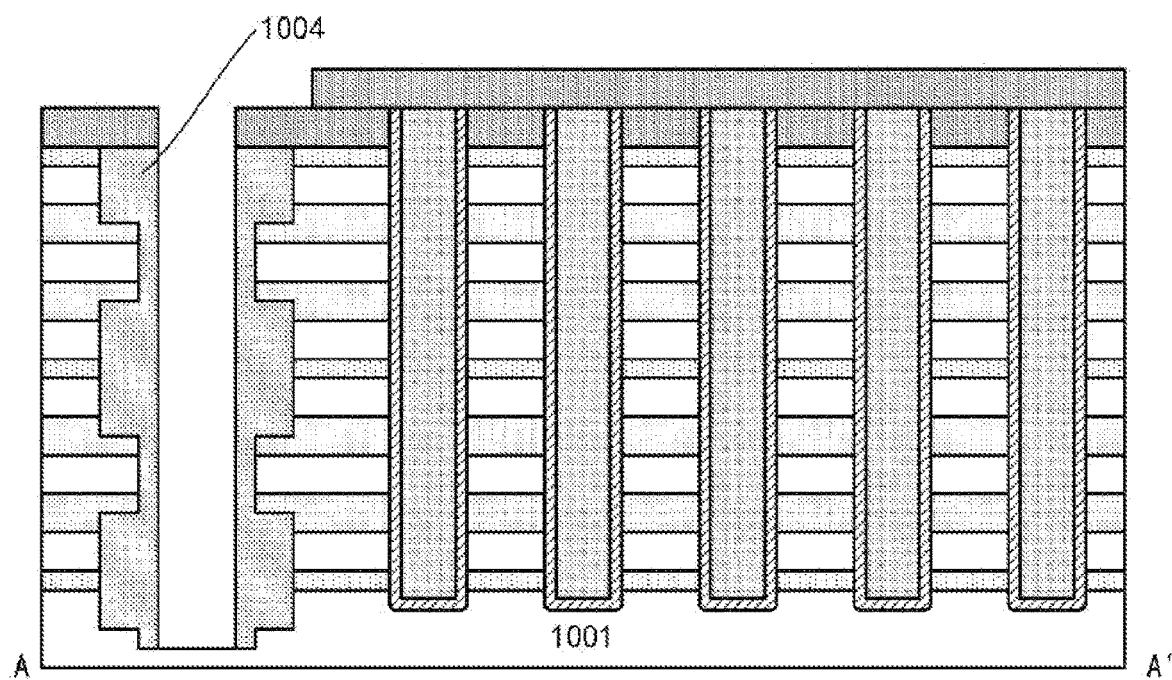

For example, as shown in FIG. 9, an isolation material layer 1004 may be formed, by depositing (e.g., CVD) and then etching back (e.g., RIE in the vertical direction), in the recess caused by the above-mentioned etching under the hard mask layer 1015 in the processing channel of the source line contact region. When etching back, the hard mask layer 1015 may be used as an etching mask. Then, the sidewall of the isolation material layer 1004 may be substantially coplanar with the sidewall of the opening in the hard mask layer 1015. The isolation material layer 1004 may include a dielectric material such as SiC.

Figure 10:
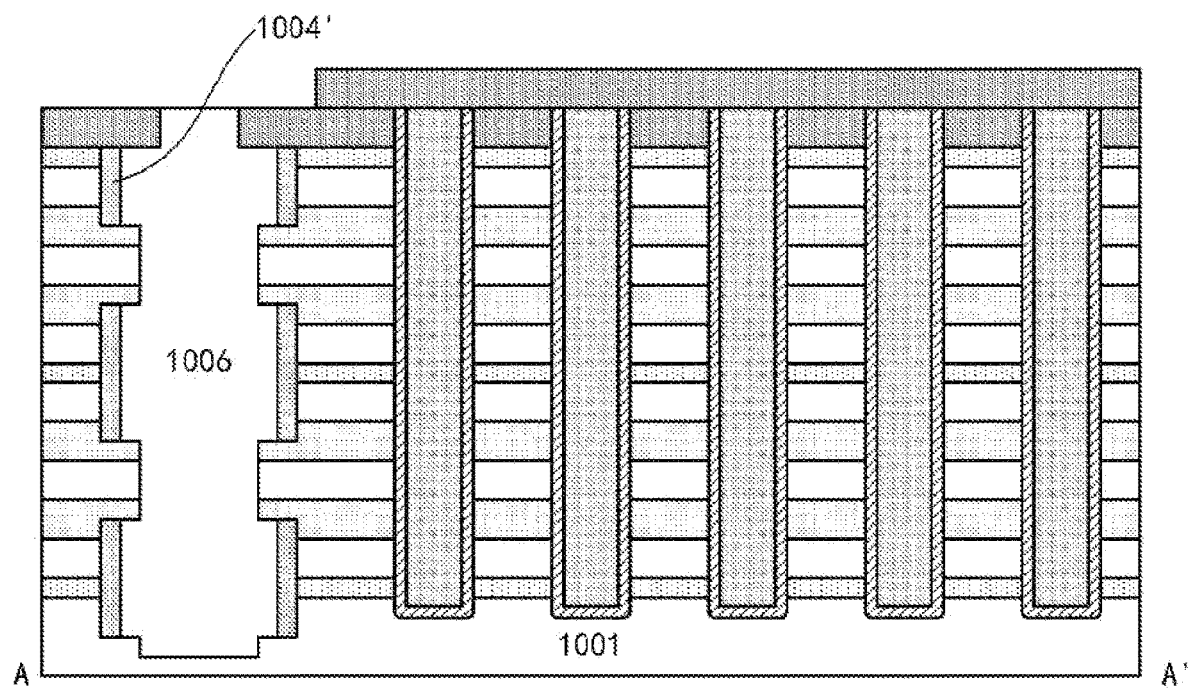

As shown in FIG. 10, the isolation material layer 1004 may be further etched back by a certain depth, especially etched back in the lateral direction via the processing channel. A depth of the etching back may be controlled so that the left isolation material layer 1004' may cover the sidewall of the first source/drain defining layer and the sidewall of the third source/drain defining layer while exposing the sidewall of the second source/drain defining layer. The left isolation material layer 1004' may form a sidewall isolation layer.

Then, a conductive material, for example, a metal such as tungsten (W), may be filled into the processing channel, so as to form a source line contact part 1006. The conductive material may be filled by a deposition, then a planarization such as CMP (which may stop at the shielding layer 1002), and then an etching back. Before the conductive material is filled, a diffusion barrier layer, such as a conductive nitride, may be formed on the sidewall and a bottom surface of the processing channel. Then, the source line contact part 1006 may be in contact with and thus electrically connected to the second source/drain defining layer (which defines the source region). In order to reduce a contact resistance, a silicidation process may be performed via the processing channel to form a silicide on the sidewall of the second source/drain defining layer before the source line contact part 1006 is formed.

Figure 11:
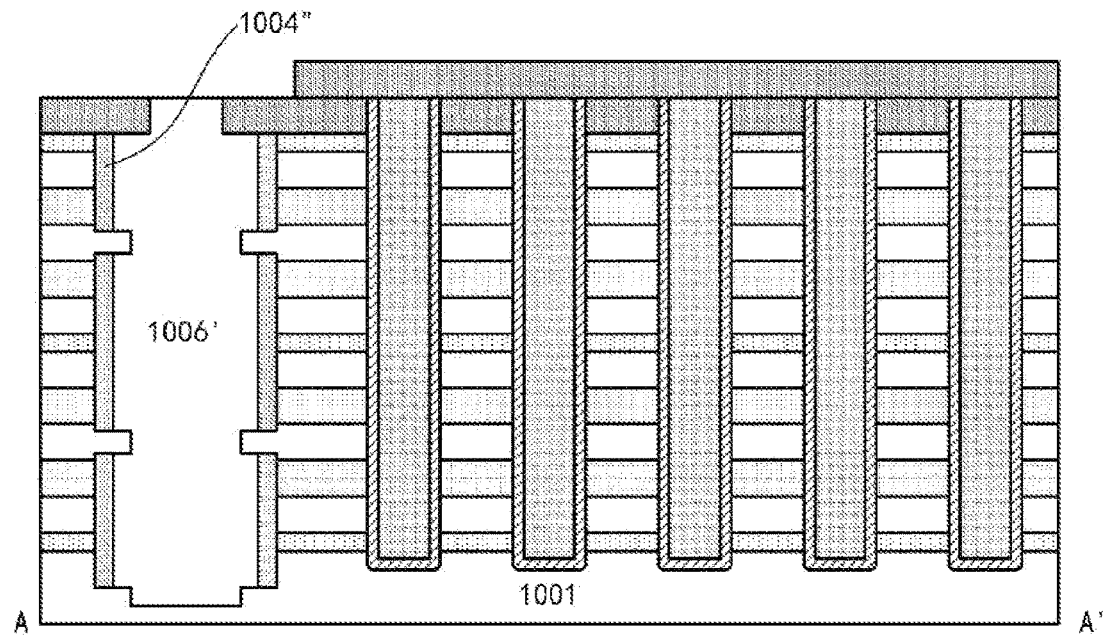

In this example, the source line contact part 1006 may be further in contact with and thus electrically connected to the channel defining layer (which defines the channel region). However, the present disclosure is not limited to this. For example, as shown in FIG. 11, in the etching described above with reference to FIG. 8 and FIG. 39, the etching may be performed into the second source/drain defining layer in the vertical direction. Therefore, in addition to the first source/drain defining layer and the third source/drain defining layer, the first channel defining layer and the second channel defining layer may also be recessed laterally relative to the second source/drain defining layer. A sidewall isolation layer 1004" may be formed according to the process described above with reference to FIG. 9 and FIG. 10. The sidewall isolation layer 1004" may cover the sidewall of the first source/drain defining layer, the sidewall of the third source/drain defining layers, the sidewall of the first channel defining layer and the sidewall of the second channel defining layer, while exposing the sidewall of the second source/drain defining layer. Then, a source line contact part 1006' may be formed as described above, which may be in contact with and thus electrically connected to the second source/drain defining layer (which defines the source region), while being isolated from the channel defining layer.

Hereinafter, a case shown in FIG. 10 is illustrated by way of example for convenience. The following description is also applicable to a case shown in FIG. 11.

In the case shown in FIG. 10, the source line contact part 1006 may apply a bulk bias to the channel defining layer. As mentioned above, the channel defining layer may be lightly doped or even may not be intentionally doped. In order to reduce a contact resistance or Schottky effect between the source line contact part 1006 and the channel defining layer, a relatively highly doped region may be formed in the channel defining layer.

Figure 12:
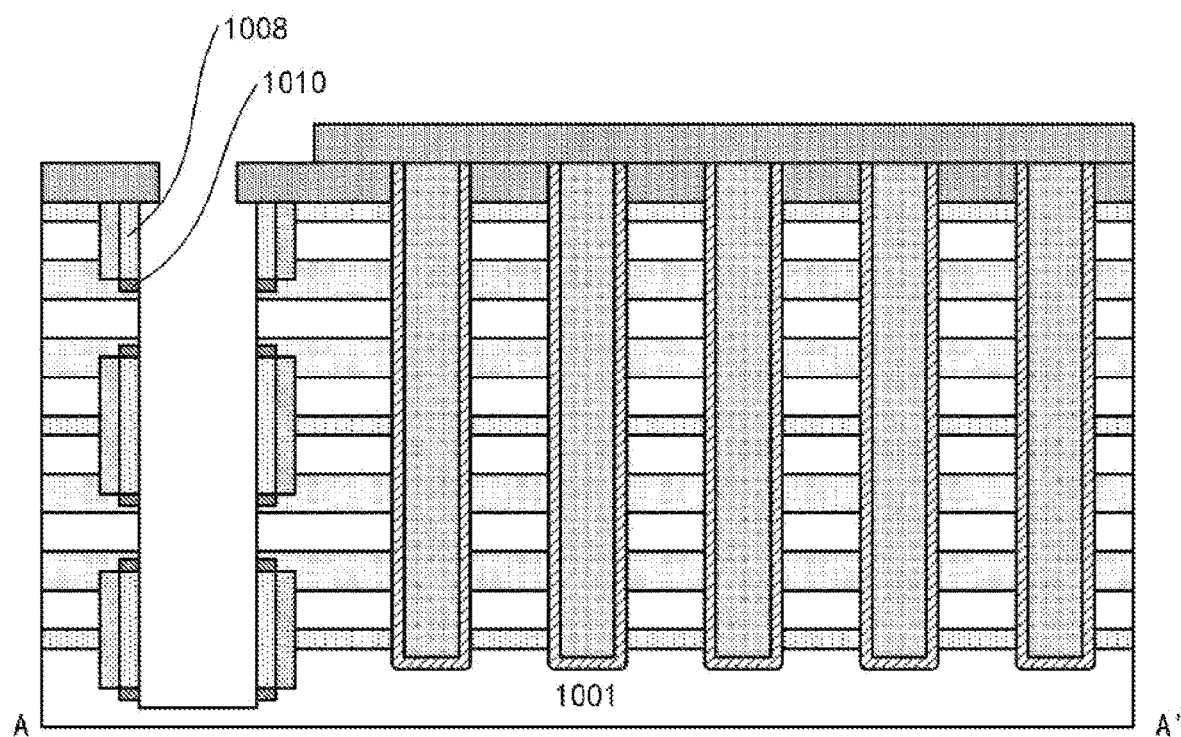

After the sidewall isolation layer 1004' is formed as described above with reference to FIG. 10, a solid phase dopant source layer 1008 may be formed, as shown in FIG. 12, according to the process described above with reference to FIG. 9 and FIG. 10. The solid phase dopant source layer 1008 may cover the sidewall isolation layer 1004' while exposing the sidewall of the second source/drain defining layer. The solid phase dopant source layer 1008 may include a dopant, for example, an oxide including a dopant, such as a phosphorosilicate glass (PSG) having a phosphorus (P) content in a range of about 0.1% to 10% (for an n-type storage cell), or a borosilicate glass (BSG) having a boron (B) content in a range of about 0.1% to 10% (for a p-type storage cell). An annealing process may be performed to drive the dopant in the solid phase dopant source layer into an adjacent channel defining layer. For example, a diffusion depth of the dopant may be in a range of about 3 nm to 50 nm, preferably about 5 nm to 20 nm, so as to avoid affecting the second source/drain defining layer having an opposite conductivity type (which is also a reason for not forming the solid phase dopant source layer 1008 on the sidewall of the second source/drain defining layer). In this way, a highly doped region 1010 is formed on the lower surface of the first channel defining layer and the upper surface of the second channel defining layer, and a doping concentration in the highly doped region 1010 is higher than that in at least a portion of the rest thereof. Then, the solid phase dopant source layer 1008 may be removed by a selective etching.

Figure 13:
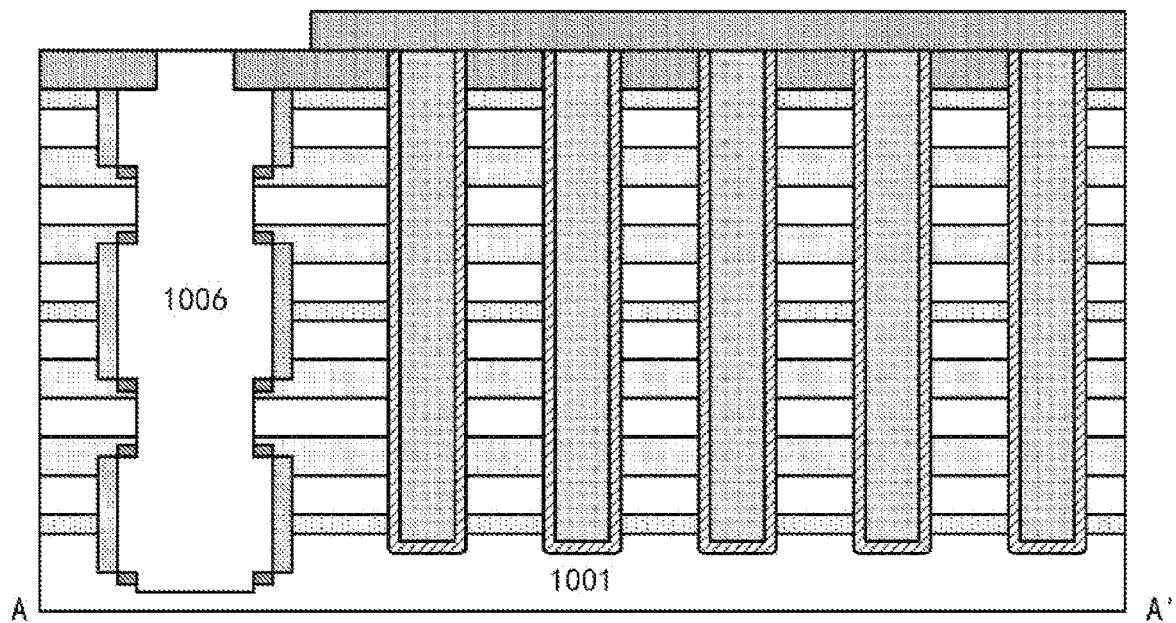

As shown in FIG. 13, the source line contact part 1006 may be formed according to the above-described process. The source line contact part 1006 may be in contact with and thus electrically connected to the channel defining layer via the highly doped region 1010.

Hereinafter, a formation of a bit line contact part in the bit line contact region will be discussed.

Figure 14A:
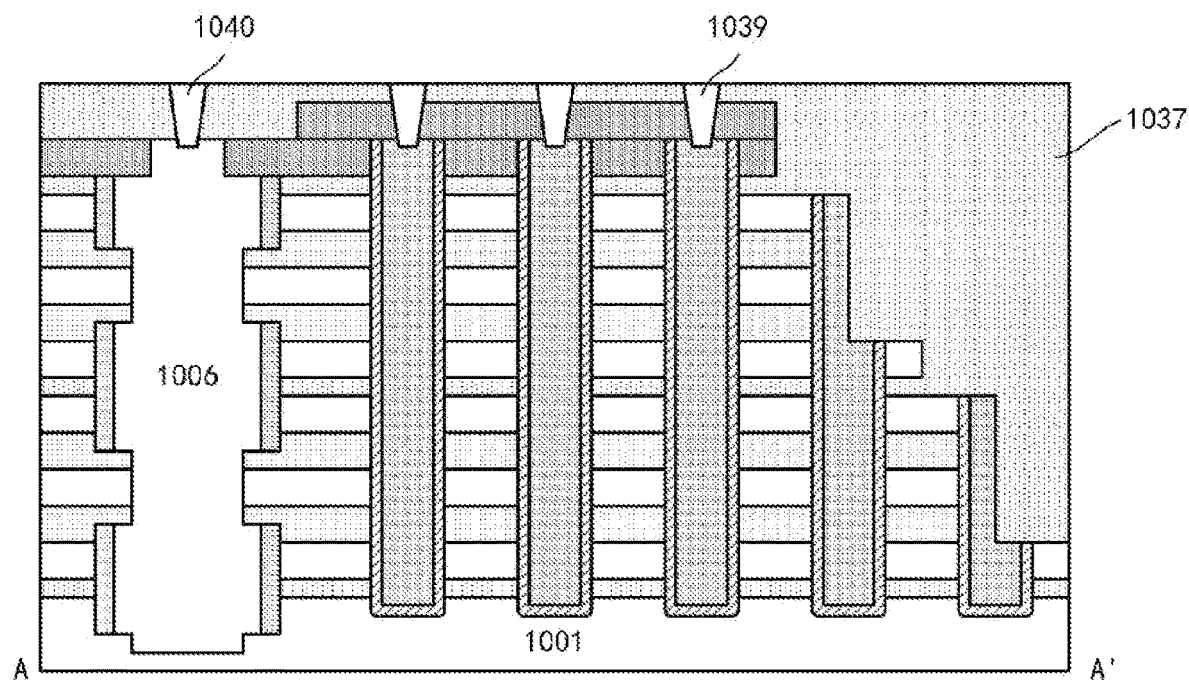
Figure 14B:
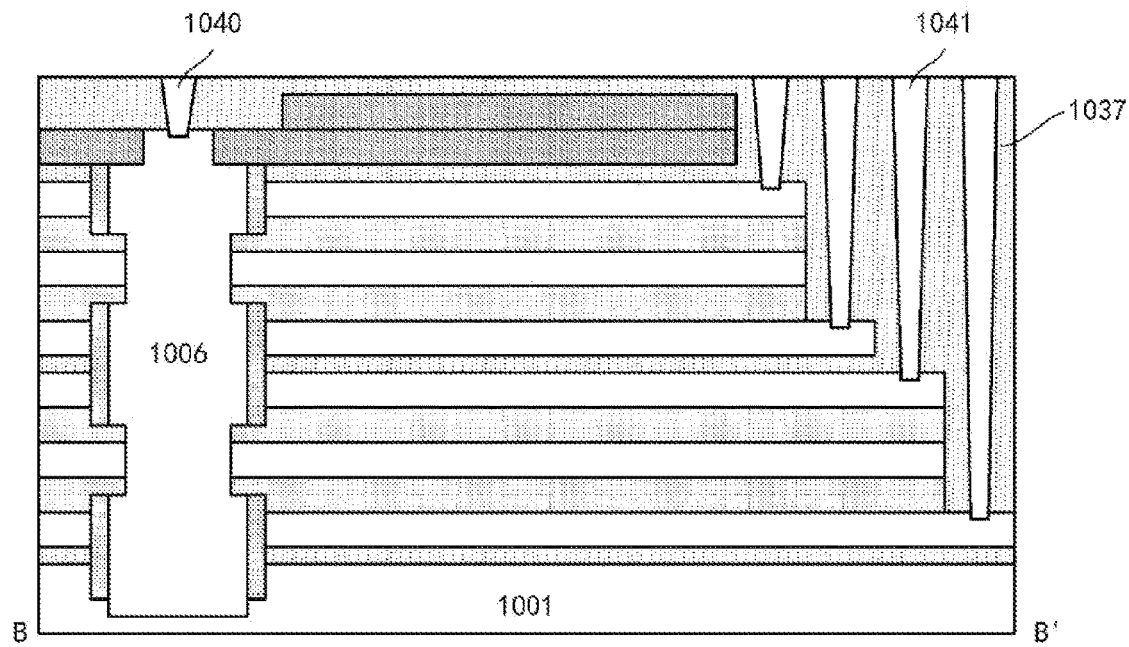

As shown in FIG. 14(*a*) and FIG. 14(*b*), a stepped structure may be formed in the bit line contact region so as to achieve bit line contact parts to respective first source/drain defining layers and third source/drain defining layers at different heights. A plurality of methods in a related art may be used to form such a stepped structure, which will not be described in detail here. With the stepped structure, an end of each first source/drain defining layer and third source/drain defining layer requiring the bit line contact part may protrude relative to an upper layer, so as to define a landing pad for the bit line contact part to the layer.

An interlayer dielectric layer 1037 may be formed by depositing an oxide and performing a planarization such as CHIP. The preceding isolation layers are shown as being integral with the interlayer dielectric layer 1037 as they include an oxide. Contact parts 1039, 1040 and 1041 may be formed in the interlayer dielectric layer 1037. Specifically, the contact part 1039 may be formed in the device region and may be electrically connected to the gate conductor layer 1027 in the gate stack; the contact part 1040 may be formed in the source line contact region and may be electrically connected to the source line contact part 1006; and the contact part 1041 may be formed in the bit line contact region and may be electrically connected to respective first source/drain defining layers and third source/drain defining layers. The contact part 1041 in the contact region may avoid a residual gate stack in the contact region. These contact parts may be formed by etching holes in the interlayer dielectric layer 1037 and filling a conductive material such as a metal in the holes.

The contact part 1039 may be electrically connected to a word line. A gate control signal may be applied to the gate conductor layer 1027 through the word line via the contact part 1039. Two storage cells stacked in a device layer may share the source/drain defining layer in the middle, i.e., the second source/drain defining layer 1009$_1$ or 1009$_2$, which may be electrically connected to the source line via the source line contact part 1006 and the contact part 1040; and the source/drain defining layers located at the upper and lower ends, i.e., the first source/drain defining layers 1005$_1$ and 1005$_2$ and the third source/drain defining layers 1013$_1$ and 1013$_2$, may be electrically connected to the bit line via the contact part 1041. In this way, a NOR-type configuration may be obtained.

A gate stack may intersect with a device layer to form two storage cells, which may facilitate the source line connection. However, the present disclosure is not limited to this. For example, a gate stack may intersect with a device layer to form only one storage cell. In this case, only the first source/drain defining layer, the first channel defining layer and the second source/drain defining layer may be provided in the device layer, and the second channel defining layer and the third source/drain defining layer are not required.

Figure 40:
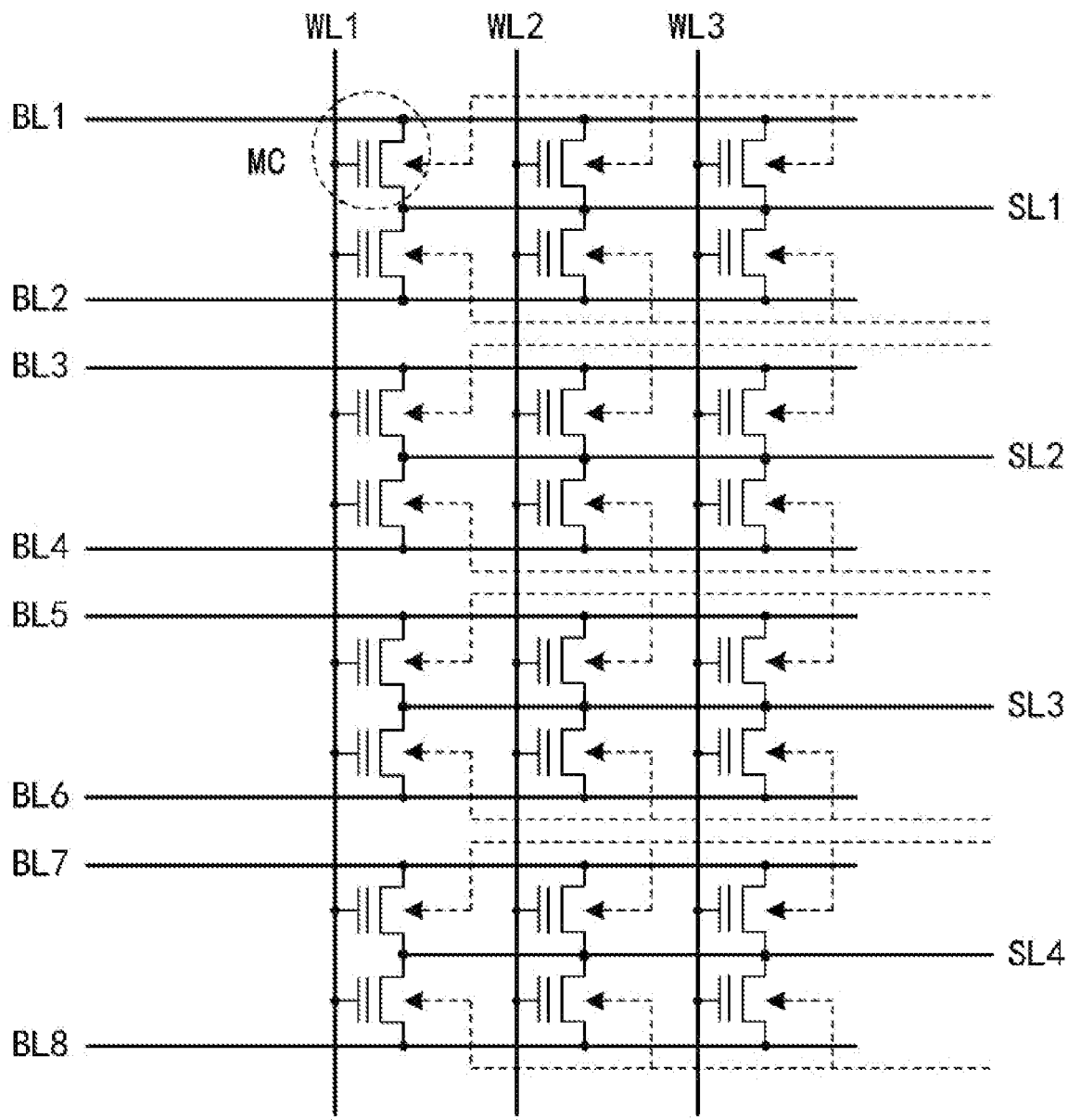
FIG. 40 schematically shows an equivalent circuit diagram of a NOR-type storage device according to the embodiments of the present disclosure.

FIG. 40 schematically shows an equivalent circuit diagram of a NOR-type storage device according to the embodiments of the present disclosure.

In the example of FIG. 40, three word lines WL1, WL2 and WL3 and eight bit lines BL1, BL2, BL3, BL4, BL5, BL6, BL7 and BL8 are schematically shown. However, the specific numbers of the bit lines and the word lines are not limited to this. A storage cell MC is provided at an intersection of the bit line and the word line. FIG. 40 further shows four source lines SL1, SL2, SL3 and SL4. As described above, storage cells in two adjacent layers in the vertical direction may share a source line connection. Moreover, the source lines may be connected to each other, for example, through the above-described source line contact part, so that the storage cells MC may be connected to a common source line. In addition, an optional bulk connection to each storage cell is schematically shown by a dashed line in FIG. 40. As described above, the bulk connection to each storage cell may be electrically connected to the source line connection of the storage cell.

A two-dimensional array of the storage cells MC is shown for convenience of illustration only. A plurality of such two-dimensional arrays may be arranged in a direction intersecting with this two-dimensional array (for example, a direction perpendicular to the paper surface of the figure), so as to obtain a three-dimensional array.

In FIG. 40, an extending direction of the word lines WL1 to WL3 may correspond to an extending direction of the gate stack, which is the vertical direction with respect to the substrate in the above-described embodiments. In this direction, adjacent bit lines are isolated from each other. This is also a reason for providing the isolation layer between adjacent device layers in the vertical direction in the above-described embodiments.

In the above-described embodiments, the doping in the source/drain region and optionally in the channel region is defined by in-situ doping during growth. However, the present disclosure is not limited to this. In order to suppress a cross-contamination that may be caused by the in-situ doping, a solid phase dopant source layer may be used to achieve a steep high source/drain doping.

FIG. 15 to FIG. 22 show schematic diagrams of some stages in a process of manufacturing a NOR-type storage device according to the embodiments of the present disclosure. A difference between this embodiment and the above-described embodiments will be mainly described below. Those not described below or not described in detail may refer to the above description.

Figure 15:
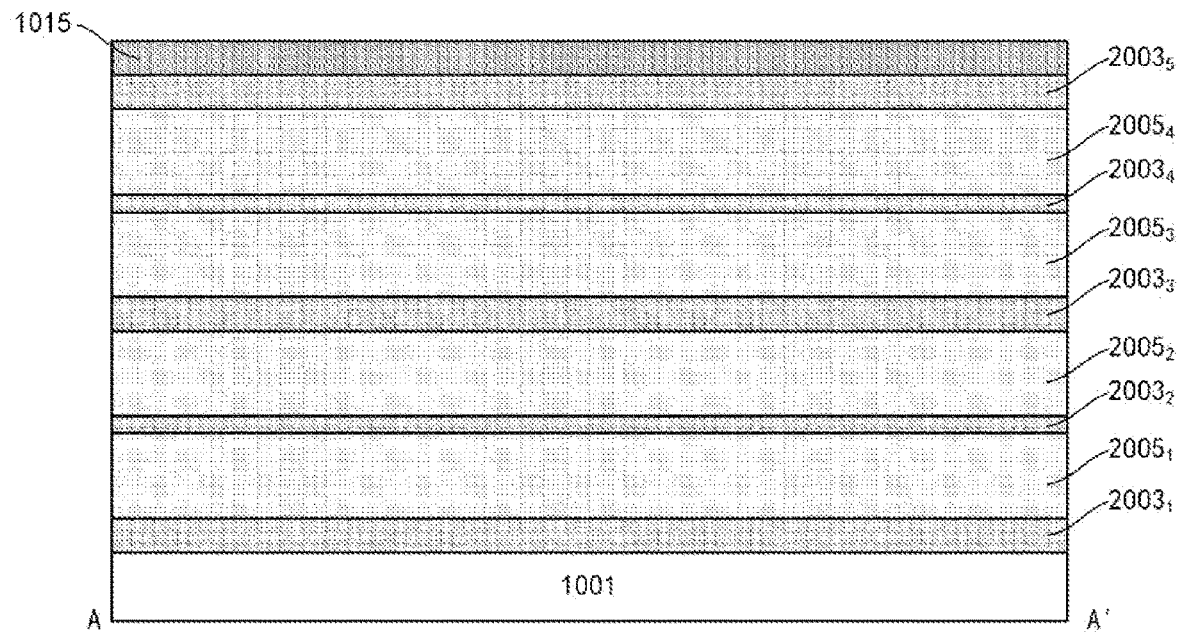
FIG. 15 to FIG. 22 show schematic diagrams of some stages in a process of manufacturing a NOR-type storage device according to another embodiment of the present disclosure.

As shown in FIG. 15, a sacrificial layer 2003$_1$ for defining an isolation layer and a device layer 2005$_1$ for defining an active region of a storage cell may be formed on the substrate 1001 by, for example, an epitaxial growth. As described above, the sacrificial layer 2003$_1$ may have an etching selectivity relative to the device layer 2005$_1$. For example, the sacrificial layer 2003$_1$ may include SiGe (in which an atomic percentage of Ge is in a range of about 15% to 30%, for example), and the device layer 2005$_1$ may include Si. The device layer 2005$_1$ may then define the active region of the storage cell and may include, for example, Si, a thickness of the device layer 2005$_1$ may be, for example, in a range of about 40 nm to 200 nm.

The device layer 2005$_1$ may be doped in situ while being grown. For example, for an n-type device, a p-type doping may be performed, and a doping concentration may be, for example, in a range of about $1E17$ cm$^{-3}$ to $1E19$ cm$^{-3}$. Such doping may define a doping characteristic in the channel region formed subsequently so as to, for example, adjust the device threshold voltage ($V_t$), improve the short channel effect, and so on. The doping concentration may have a non-uniform distribution in the vertical direction, so as to optimize the device performance. For example, the concentration is relatively high in a region close to the drain region (which is then connected to the bit line) to reduce the short channel effect, while the concentration is relatively low in a region close to the source region (which is then connected to the source line) to reduce the channel resistance. This may be achieved by introducing different doses of dopant in different stages of growth.

Similarly, a plurality of device layers may be provided. For example, device layers $2005_2$, $2005_3$ and $2005_4$ may be arranged on the device layer $2005_1$ by an epitaxial growth, and the device layers may be separated from each other by sacrificial layers $2003_2$, $2003_3$ and $2003_4$ for defining isolation layers. Only four device layers are shown in FIG. 15, but the present disclosure is not limited thereto. According to the circuit design, the isolation layer may not be provided between some device layers. The device layers $2005_2$, $2005_3$ and $2005_4$ may have the same or similar thickness and/or material as the device layer $2005_1$, or may have a different thickness and/or material from the device layer $2005i$. For convenience of description only, it is assumed that each device layer has the same configuration.

A sacrificial layer $2003_5$ and a hard mask layer 1015 may be formed on the device layer.

Two adjacent device layers in the vertical direction are divided into a group to set a thickness of a sacrificial layer differently. Specifically, a thickness of a sacrificial layer between two device layers in a group (e.g., the sacrificial layer $2003_2$ between the device layers $2005_1$ and $2005_2$ in a group, the sacrificial layer $2003_4$ between the device layers $2005_3$ and $2005_4$ in a group) may be less than that of a sacrificial layer on upper and lower sides of the group (e.g., the sacrificial layer $2003_1$ on a lower side of the group of the device layers $2005_1$ and $2005_2$, the sacrificial layer $2003_3$ on an upper side of the group of the device layers $2005_1$ and $2005_2$ (i.e., a lower side of the group of the device layers $2005_3$ and $2005_4$), the sacrificial layer $2003_5$ on an upper side of the group of the device layers $2005_3$ and $2005_4$), and the thicker one preferably exceeds the thinner one by more than 5 nm. The thicker sacrificial layers $2003_1$, $2003_3$ and $2003_5$ may have a thickness, for example, in a range of about 10 nm to 50 nm.

Figure 16:
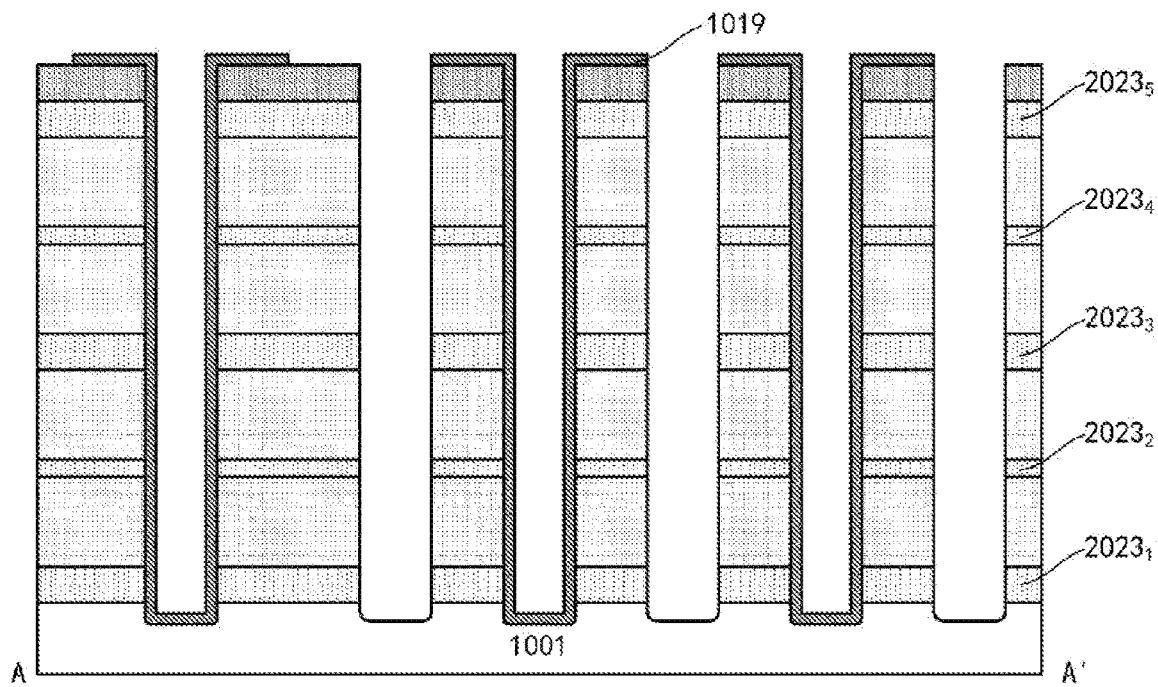

Then, the processing channel T may be formed as described above, and the support layer 1019 may be formed in some processing channels. In a case of an existence of the support layer 1019, the sacrificial layers $2003_1$, $2003_2$, $2003_3$, $2003_4$ and $2003_5$ may be replaced with isolation layers $2023_1$, $2023_2$, $2023_3$, $2023_4$ and $2023_5$, as shown in FIG. 16.

According to the embodiments of the present disclosure, in order to achieve the source/drain doping, the isolation layers $2023_1$ to $2023_5$ may include a dopant (n-type dopant for n-type storage cell and p-type dopant for p-type storage cell). The isolation layers $2023_1$ to $2023_5$ may be solid phase dopant source layers. For example, the isolation layers $2023_1$ to $2023_5$ may include phosphorosilicate glass (PSG) having a phosphorus (P) content in a range of about 0.1% to 10% (for n-type storage cell) or borosilicate glass (BSG) having a boron (B) content in a range of about 0.1% to 10% (for p-type storage cell).

After that, the support layer 1019 may be removed by a selective etching.

Figure 17:
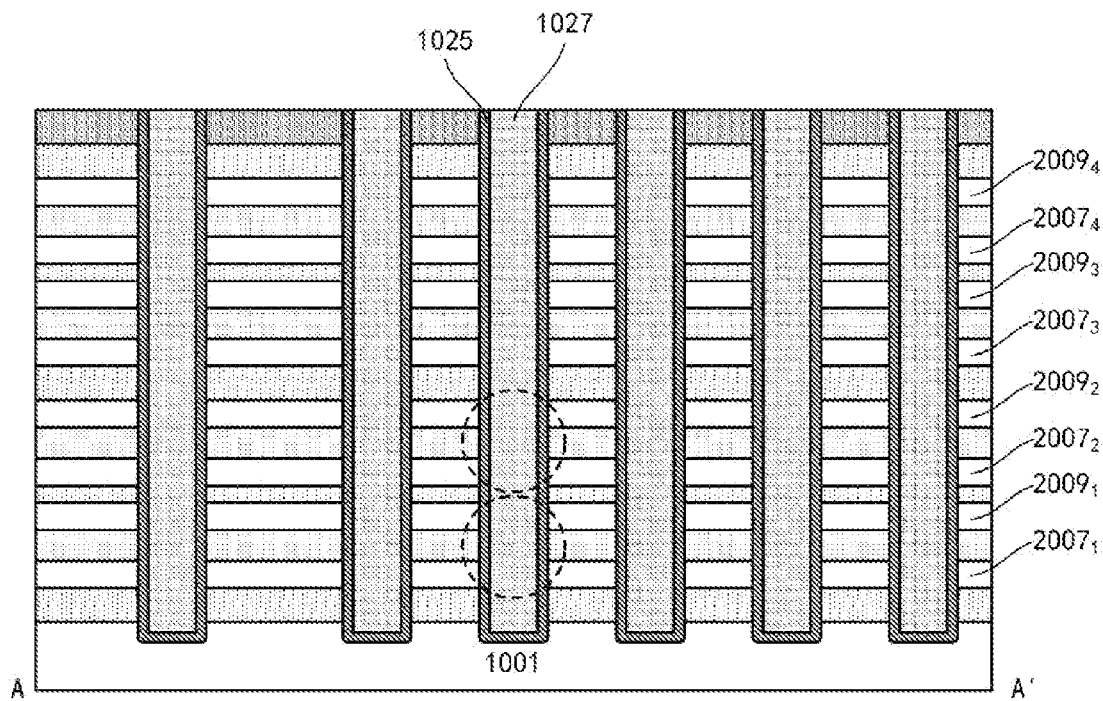

As shown in FIG. 17, a gate stack including the storage function layer 1025 and the gate conductor layer 1027 may be formed in the processing channel.

An annealing process may be performed to drive the dopant in the solid phase dopant source layer into the device layer. For each of the device layers $2005_1$ to $2005_4$, the dopant in the isolation layers at the upper and lower ends of the device layers may enter the device layers $2005_1$ to $2005_4$ from the upper and lower ends, respectively, so that highly doped regions $2007_1$, $2009_1$; $2007_2$, $2009_2$; $2007_3$, $2009_3$; $2007_4$, $2009_4$ may be formed at the upper and lower ends (e.g., n-type doping in a range of about $1E19$ cm$^{-3}$ to $1E21$ cm$^{-3}$), so as to define the source/drain regions. A diffusion depth of the dopant from the isolation layer to the device layer may be controlled (e.g., to be in a range of about 10 nm to 50 nm), so that a relatively low doping may be kept in the middle of the device layer in the vertical direction, for example, a doping polarity (e.g., a p-type doping) and a doping concentration (e.g., in a range of $1E17$ cm$^{-3}$ to $1E19$ cm$^{-3}$) caused by the in-situ doping during the growth may be substantially kept, and the channel region may be defined.

The doping concentration achieved by the in-situ doping is generally lower than $1E20$ cm$^{+3}$. According to the embodiments of the present disclosure, the source/drain doping is performed by the diffusion from the solid phase dopant source layer, which may achieve a high doping. For example, a highest doping concentration may be greater than $1E20$ cm$^{-3}$, even up to be in a range of about $7E20$ cm$^{-33}$ to $3E21$ cm$^{-3}$. Moreover, due to the diffusion characteristic, the source/drain region may have a doping concentration distribution that decreases from a side close to the solid phase dopant source layer to a side close to the channel region in the vertical direction.

Such diffusion doping may achieve a steep doping concentration distribution. For example, a steep doping concentration change, such as by less than about 5 nm/dec to 20 nm/dec (i.e., a drop of at least one order of magnitude in the doping concentration occurs in a range of less than about 5 nm to 20 mm) may exist between the source/drain region and the channel region. Such a sudden change region in the vertical direction may be referred to as an "interface layer".

Since the diffusion occurs from the isolation layer into the device layer with substantially the same diffusion characteristic, each of the source/drain regions $2007_1$, $2009_1$; $2007_2$, $2009_2$; $2007_3$, $2009_3$; $2007_4$, $2009_4$ may be substantially coplanar in the lateral direction. Similarly, each channel region may be substantially coplanar in the lateral direction. In addition, as described above, the channel region may have a non-uniform distribution in the vertical direction, the doping concentration in a portion close to the source/drain region (the drain region) on one side is relatively high, and the doping concentration in a portion close to the source/drain region (the source region) on the other side is relatively low.

As shown in FIG. 17, the gate stack (1025/1027) including the storage function layer is surrounded by the device layer. The gate stack may cooperate with the device layer to define a storage cell, as shown by a dashed circle in FIG. 17. The channel region may connect the source/drain regions at opposite sides, and the channel region may be controlled by the gate stack. In a single storage cell, one of the source/drain regions at upper and lower ends is used as the source region and may be electrically connected to the source line, and the other one of the source/drain regions at upper and lower ends is used as the drain region and may be electrically connected to the bit line. For two vertically adjacent storage cells, the source/drain region at the upper end of the lower storage cell and the source/drain region at the lower end of the upper storage cell may be used as source regions, so that they may share a source line connection.

In this embodiment, the gate stack is firstly formed and then the diffusion doping is performed. However, the present disclosure is not limited to this. For example, the diffusion doping may be firstly performed and then the gate stack is formed. Moreover, after the diffusion doping, the solid phase dopant source layer may be replaced by other materials. For example, the solid phase dopant source layer may be replaced by other dielectric materials, especially a dielectric material that does not intentionally include a dopant, so as to improve an isolation performance. Alternatively, the solid phase dopant source layer between the device layers in a group (e.g., the solid phase dopant source layer $2023_2$ between the device layers $2005_1$ and $2005_2$ in a group, the solid phase dopant source layer $2023_4$ between the device layers $2005_3$ and $2005_4$ in a group) may be replaced by a conductive material such as a metal or a doped semiconductor layer, so as to reduce an interconnect resistance (to the source line); while the solid phase dopant source layer on the upper and lower sides of a group (e.g., the solid phase dopant source layer $2023_1$ on the lower side of the group of the device layers $2005_1$ and $2005_2$, the solid phase dopant source layer $2023_3$ on the upper side of the group of the device layers $2005_1$ and $2005_2$ (i.e., the lower side of the group of the device layers $2005_3$ and $2005_4$), the solid phase dopant source layer $2023_5$ on the upper side of the group of the device layers $2005_3$ and $2005_4$) may be replaced by a dielectric material, so as to achieve an isolation between bit lines. In a case that the solid phase dopant source layer is replaced, an "interface layer" with a sudden change in doping concentration as described above may be also formed on a side of the source/drain region away from the channel region.

Next, the source line contact part may be fabricated in the source line contact region.

As described above, in order to achieve a correct electrical connection of the source line contact part, the drain region in the device layer needs to be recessed laterally relative to the source region. The source/drain region adjacent to the thinner isolation layers $2023_2$ and $2023_4$ in each device layer may be used as the source region, and the source/drain region adjacent to the thicker isolation layers $2023_1$, $2023_3$ and $2023_5$ may be used as the drain region. To achieve such recessing, as described above, a surface of the drain region in each device layer may be exposed more. This may be achieved by relatively recessing the thicker isolation layers $2023_1$, $2023_3$ and $2023_5$ in the lateral direction.

Figure 18:
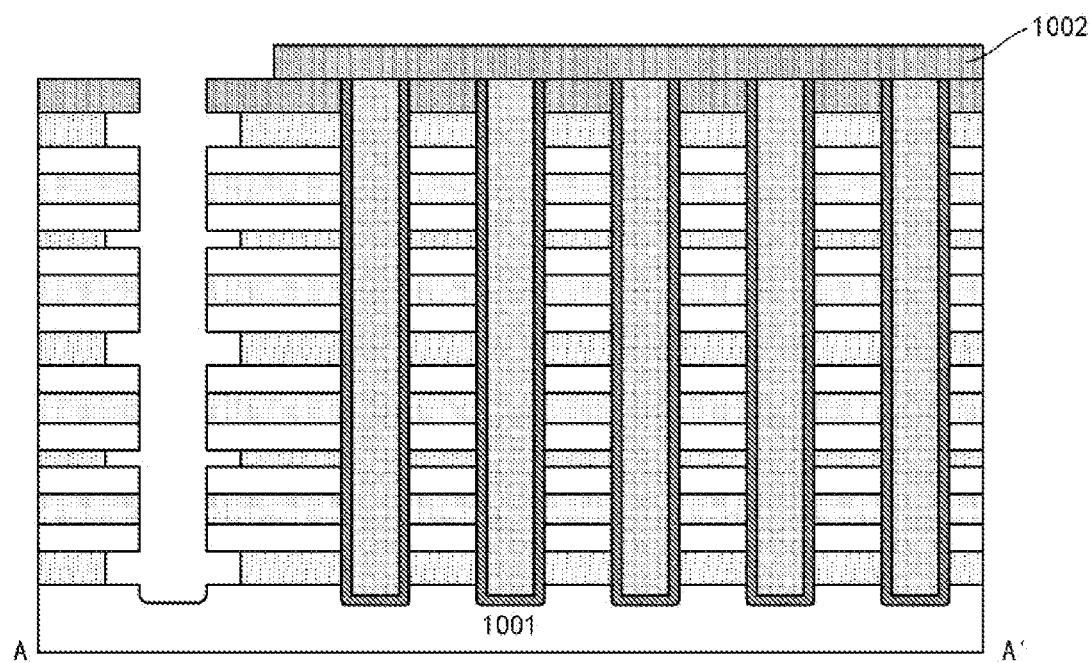

For example, as shown in FIG. 18, the gate stack may be removed in the source line contact region so as to expose the processing channel. The thicker isolation layers $2023_1$, $2023_3$ and $2023_5$ may be laterally recessed by a depth through a selective etching via the processing channel. The thinner isolation layers $2023_2$ and $2023_4$ may also be recessed. A recessing depth of the isolation layers $2023_1$ to $2023_5$ may be controlled to be greater than a thickness of the thinner isolation layers $2023_2$ and $2023_4$.

Figure 19:
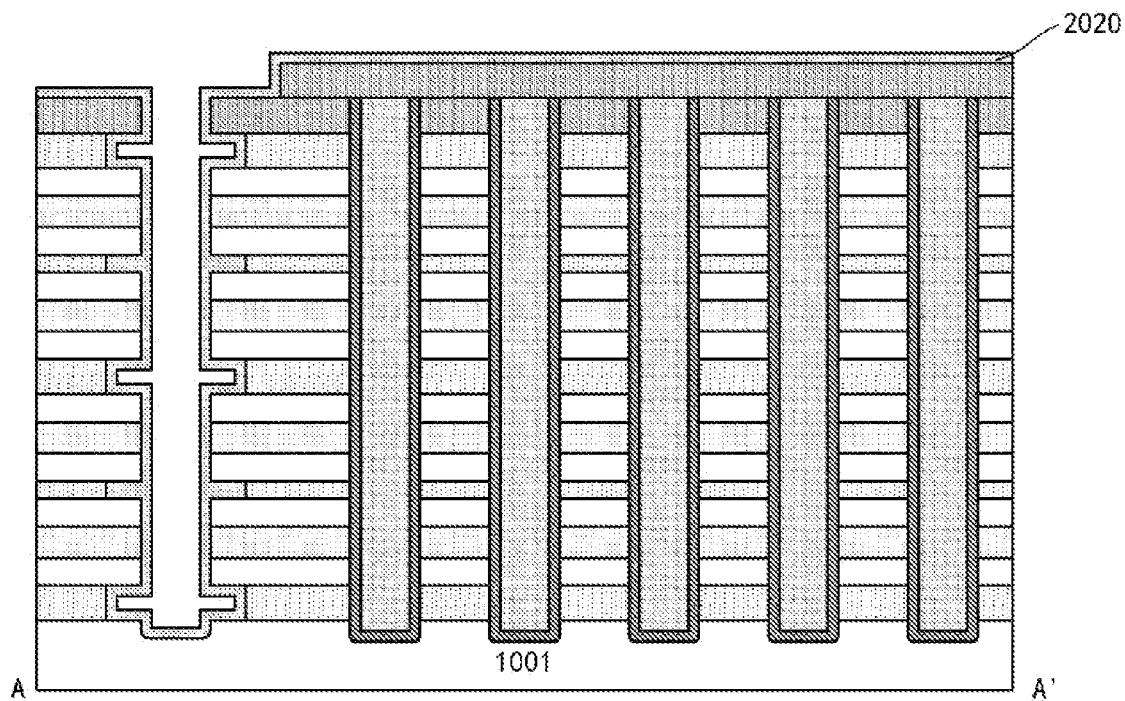

A filling plug may be formed in a recess formed in the thinner isolation layers $2023_2$ and $2023_4$. For example, as shown in FIG. 19, a plug material layer 2020 may be formed in a substantially conformal manner by deposition. A deposition thickness of the plug material layer 2020 may be controlled to be greater than half of the thickness of the thinner isolation layers $2023_2$ and $2023_4$ (so that the recess formed in the thinner isolation layers $2023_2$ and $2023_4$ may be completely filled), and less than half of the thickness of the thicker isolation layers $2023_1$, $2023_3$ and $2023_5$ (so that the recess formed in the thicker isolation layers $2023_1$, $2023_3$ and $2023_5$ may not be completely filled). ALD may be used to control the deposition thickness well. Considering the etching selectivity, the plug material layer 2020 may include, for example, SiC.

Figure 20:
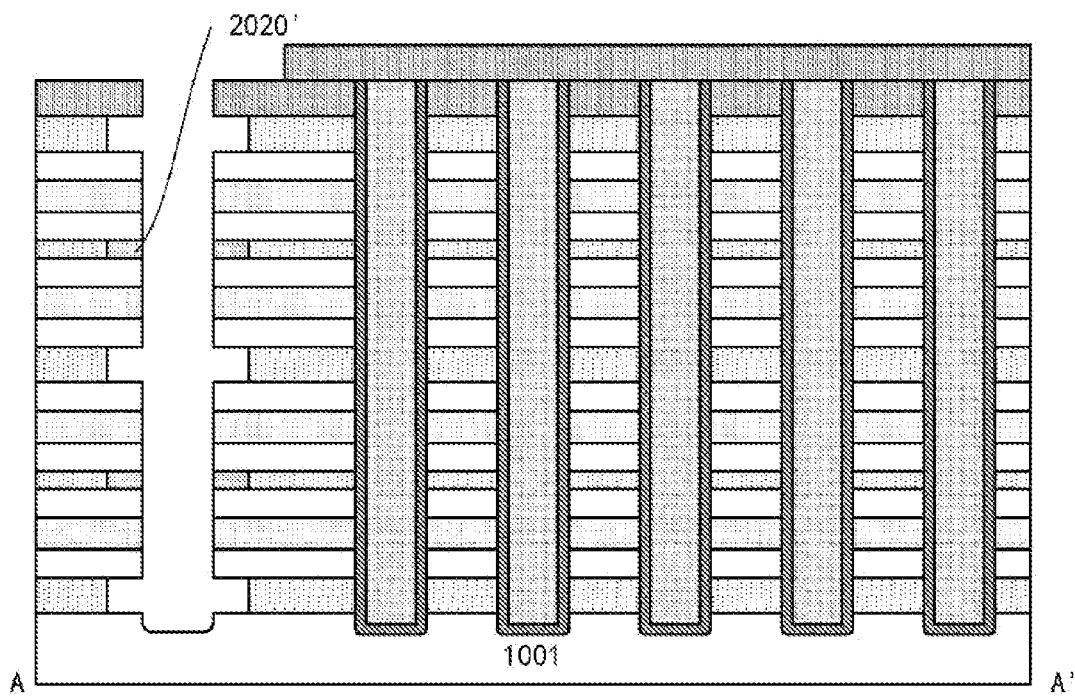

After that, as shown in FIG. 20, a thickness of the plug material layer 2020 may be removed by a selective etching. For example, a removal thickness may be substantially equal to or slightly greater than the deposition thickness of the plug material layer 2020. Then, the plug material layer 2020 may be removed from the recess formed in the thicker isolation layers $2023_1$, $2023_3$ and $2023_5$, and left in the recess formed in the thinner isolation layers $2023_2$ and $2023_4$, so as to form a filling plug 2020'. ALE may be used to control the removal thickness well.

Figure 21:
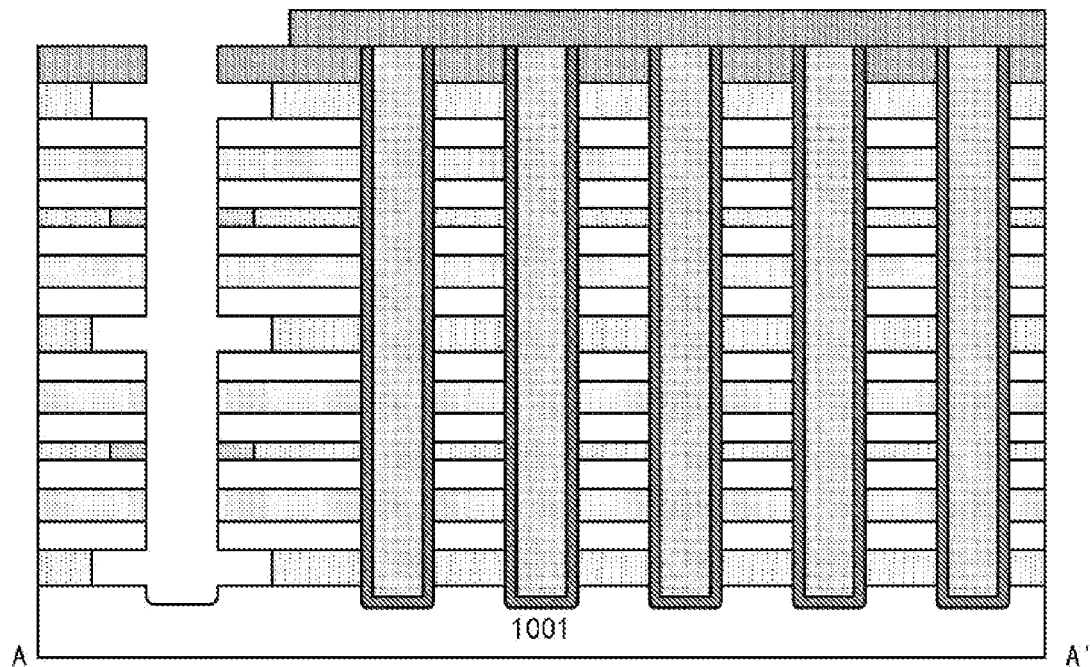

As shown in FIG. 21, the thicker isolation layers $2023_1$, $2023_3$ and $2023_5$ may be further recessed laterally by a selective etching, so as to better achieve the lateral recessing of the drain region relative to the source region. Further recessing of the thinner isolation layers $2023_2$ and $2023_4$ in the lateral direction may be avoided due to the existence of the filling plug 2020'.

Figure 22:
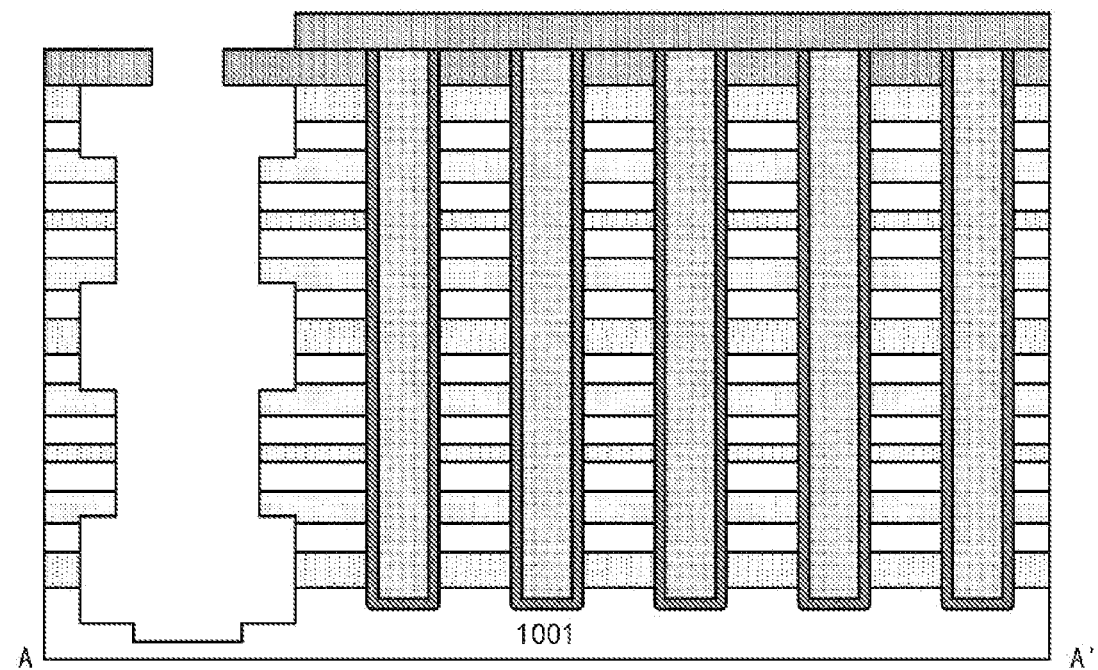

As shown in FIG. 22, the device layer may be selectively etched. Since the surface of the drain region is exposed more than that of the source region in each device layer, as described above, the drain region may be laterally recessed relative to the source region. In the example shown in FIG. 22, such etching may proceed into the channel region, so that the source line contact part formed subsequently may also contact the channel region. As described above, such etching may also proceed into the source region, so that the source line contact part formed subsequently may contact only the source region.

Then, the filling plug 2020' may be removed by a selective etching, and each isolation layer may be further selectively etched to be further laterally recessed so that the isolation layer may not protrude to affect the formation of the sidewall isolation layer.

In the processing channel processed in such manner in the source line contact region, a source line contact part may be formed as described above. In addition, in the bit line contact region, a bit line contact part may be formed as described above, which will not be described in detail here.

In the above embodiments, the isolation layer adjacent to the source region is thinner, and the isolation layer adjacent to the drain region is thicker. However, the present disclosure is not limited to this. For example, the isolation layer adjacent to the source region may be thicker, and the isolation layer adjacent to the drain region may be thinner.

FIG. 23 to FIG. 26 show schematic diagrams of some stages in a process of manufacturing a NOR-type storage device according to the embodiments of the present disclosure. A difference between this embodiment and the above-described embodiments will be mainly described below. Those not described below or not described in detail may refer to the above description.

Figure 23:
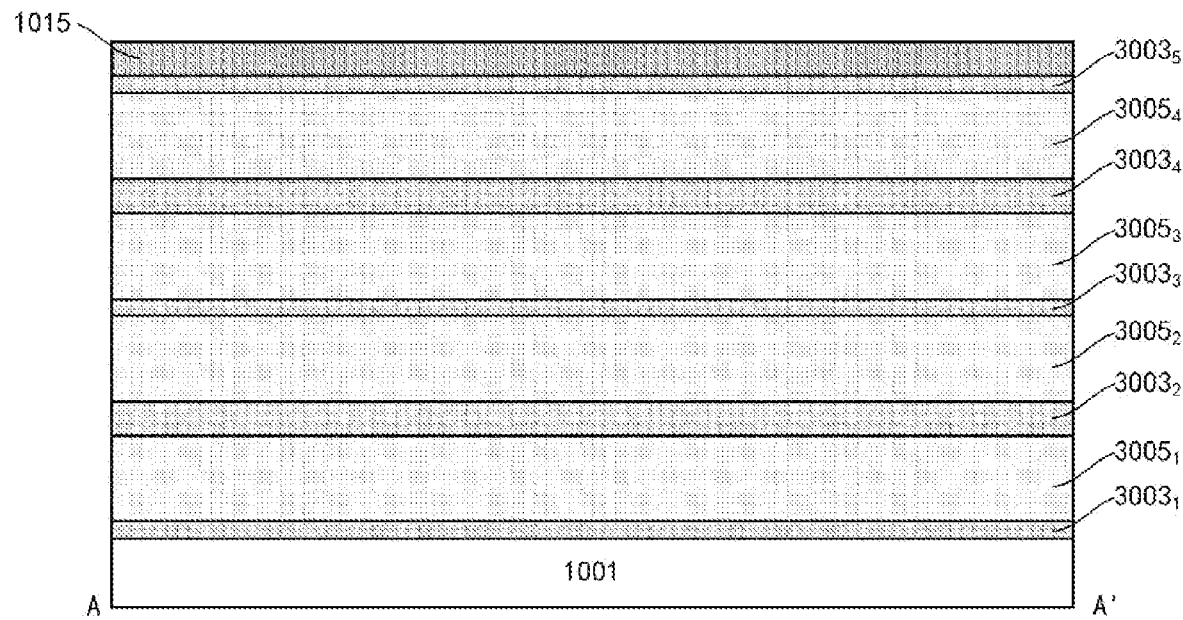
FIG. 23 to FIG. 26 show schematic diagrams of some stages in a process of manufacturing a NOR-type storage device according to another embodiment of the present disclosure.

As shown in FIG. 23, sacrificial layers $3003_1$, $3003_2$, $3003_3$, $3003_4$ and $3003_5$ for defining the isolation layer and device layers $3005_1$, $3005_2$, $3005_3$ and $3005_4$ for defining the active region of the storage cell may be formed on the substrate 1001 by, for example, an epitaxial growth. These sacrificial layers and device layers may be the same as those described above with reference to FIG. 15, except that the thickness of the sacrificial layers $3003_1$, $3003_2$, $3003_3$, $3003_4$, and $3003_5$ are set differently. Specifically, in this embodiment, the sacrificial layers $3003_1$, $3003_3$ and $3003_5$ are thinner, and the sacrificial layers $3003_2$ and $3003_4$ are thicker. A thickness of the thicker sacrificial layer may be, for example, more than 5 nm, than that of the thinner sacrificial layer.

Figure 24:
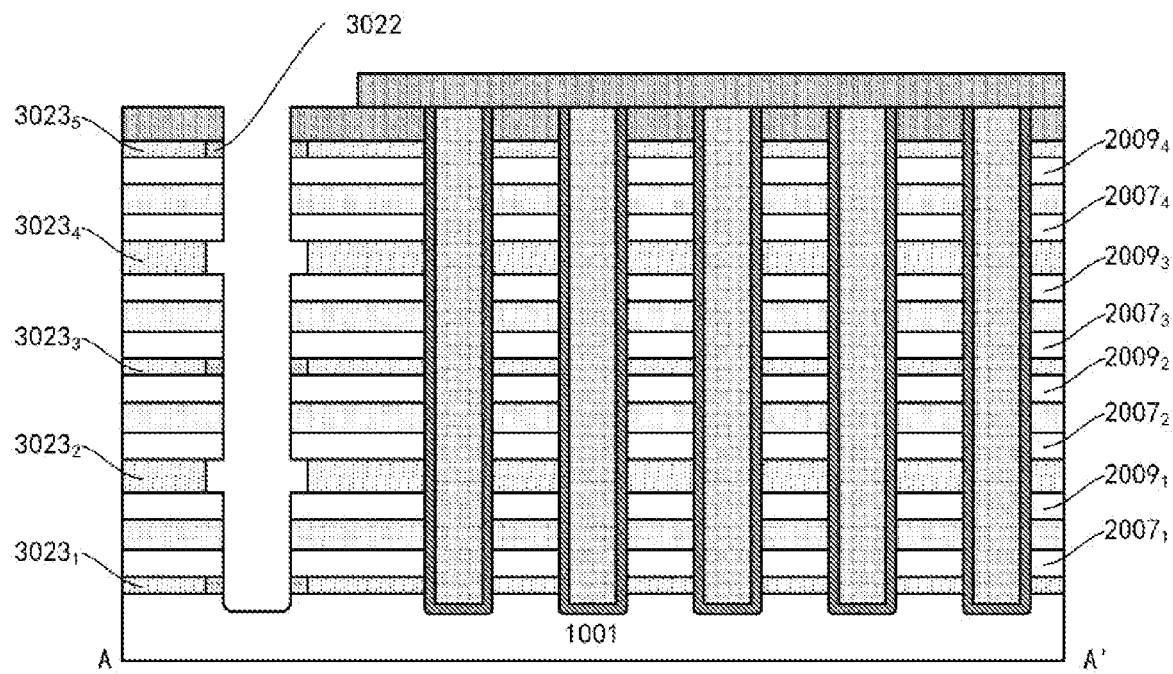

A storage device may be fabricated according to the above embodiments. As shown in FIG. 24, in the source line contact region, a filling plug 3022 may be formed according to the method of forming the filling plug as described above. However, the filling plug 3022 is formed on the sidewalls of the thinner isolation layers $3023_1$, $3023_3$ and $3023_5$. Considering the etching selectivity, the filling plug 3022 may include SiGe (e.g., an atomic percentage of Ge is in a range of about 15% to 45%).

Figure 25:
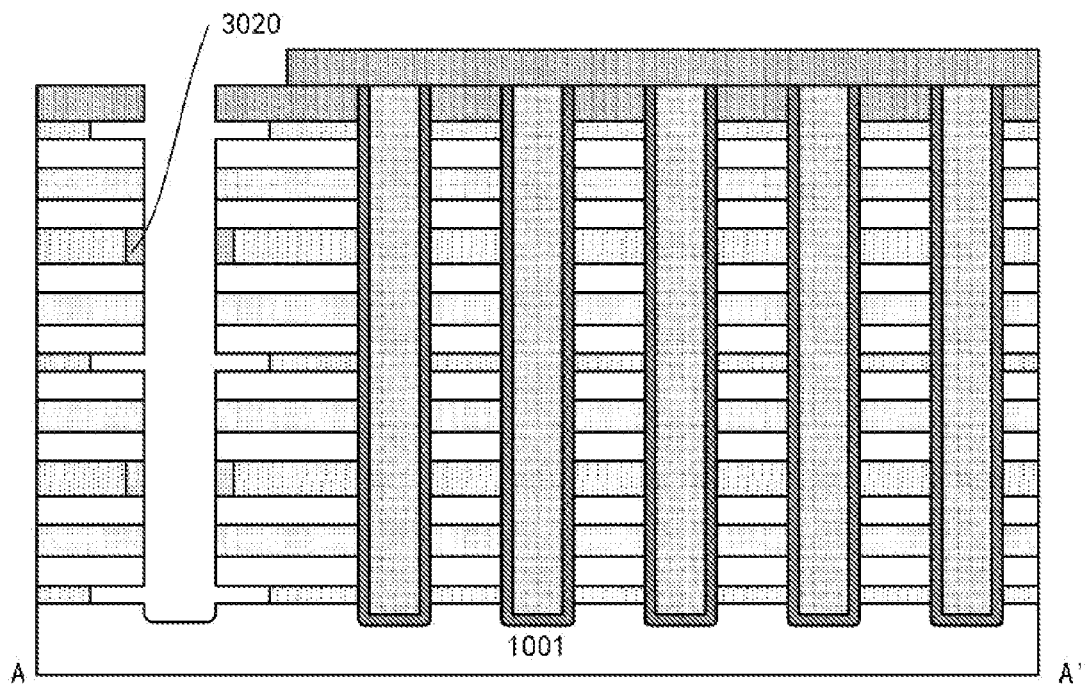

As shown in FIG. 25, an additional filling plug 3020 may be formed by deposition and then etching back, such as RIE in the vertical direction. The filling plug 3020 may be formed on the sidewalls of the thicker isolation layers $3023_2$ and $3023_4$. For example, the filling plug 3020 may include SiC. Then, the filling plug 3022 may be removed to expose the thinner isolation layers $3023_1$, $3023_3$ and $3023_5$, which may be laterally recessed by a selective etching.

Figure 26:
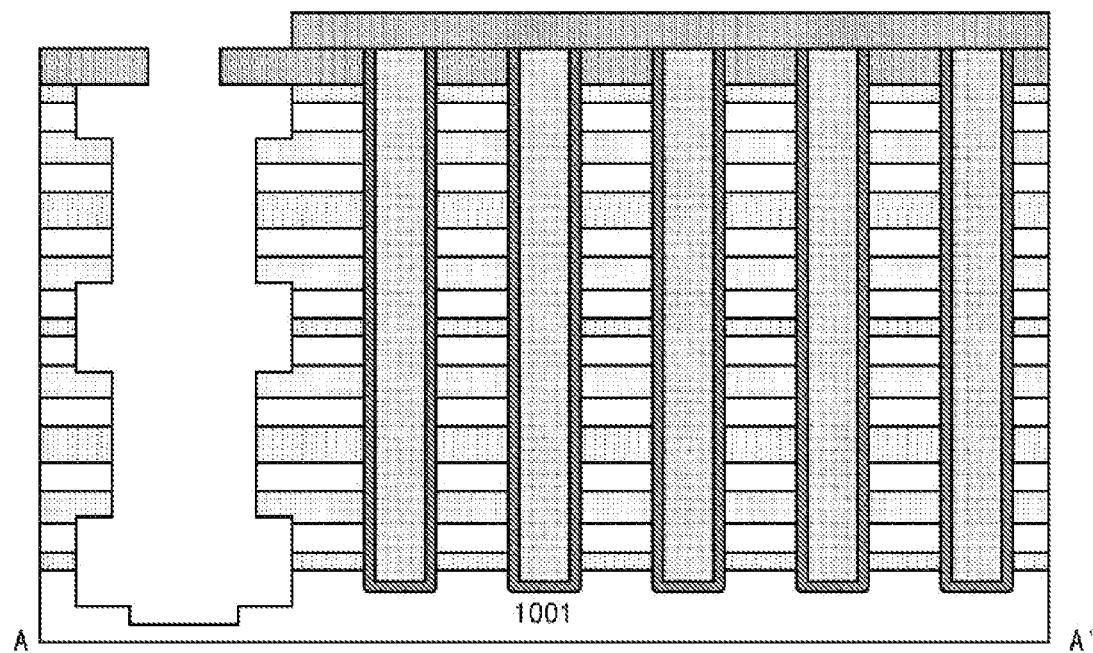

The structure in FIG. 25 is similar to that described above with reference to FIG. 21. The device layer may be etched as described above to achieve a lateral recessing of the drain region relative to the source region, as shown in FIG. 26. Then, the source line contact part and the bit line contact part may be fabricated as described above.

In the above embodiments, the active region is defined by the device layer as a bulk material, and thus the channel region is formed in the bulk material. In this case, the process is simple. However, the present disclosure is not limited to this.

FIG. 27 to FIG. 38 show schematic diagrams of some stages in a process of manufacturing a NOR-type storage device according to the embodiments of the present disclosure. A difference between this embodiment and the above-described embodiments will be mainly described below. Those not described below or not described in detail may refer to the above description.

Figure 27:
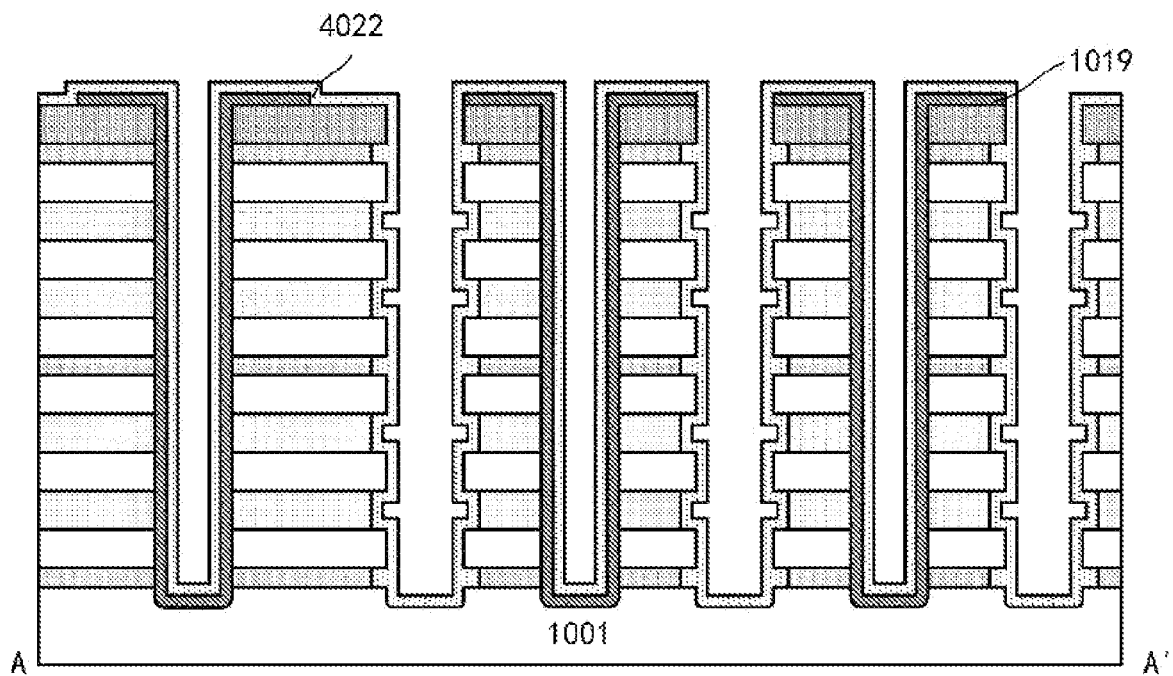

As shown in FIG. 27, a device layer may be provided on the substrate 1001. The arrangement of the device layer in this embodiment is the same as that shown in FIG. 1, except that the channel defining layer has an etching selectivity relative to the source/drain defining layer. Thus, reference signs in FIG. 1 are used for these device layers. For example, the first channel defining layer $1007_1$ and the second channel defining layer $1011_1$ may include SiGe (an atomic percentage of Ge is, for example, in a range of about 15% to 30%), and the first source/drain defining layer $1005_1$, the second source/drain defining layer $1009_1$, and the third source/drain defining layer $1013_1$ may include Si. Moreover, considering the following process, the thickness of the sacrificial layers $1003_1$, $1003_2$ and $1003_3$ may be different from, for example, less than the thickness of the channel defining layers $1007_1$, $1011_1$, $1007_2$ and $1011_2$.

After the support layer 1019 is formed as described above with reference to FIG. 2(a) to FIG. 4, the sacrificial layer may be replaced via the processing channel. However, in this example, both the sacrificial layer and the channel defining layer include SiGe. In this case, an operation of replacing with the isolation layer may affect the channel defining layer. A protective plug self-aligned to the channel defining layer may be formed to prevent the channel defining layer from being affected by the operation of replacing with the isolation layer. It should be noted that in the case that the sacrificial layer and the channel defining layer have etching selectivity with respect to each other, the operation of forming a protective plug may be omitted.

For example, as shown in FIG. 27, the channel defining layers $1007_1$, $1011_1$, $1007_2$ and $1011_2$ may be recessed (relative to the upper and lower source/drain defining layers) in the lateral direction by a selective etching. ALE may be used to control the etching depth well. Then, a protective gap self-aligned to the channel defining layer may be formed. After that, a protective plug may be formed in the protective gap. The sacrificial layers $1003_1$ to $1003_3$ may be also relatively recessed, so that an isolation gap is formed.

In order to prevent the protective plug from being formed in the isolation gap and thereby hindering the replacement of the sacrificial layer, a filling plug may be formed in the isolation gap. For example, a plug material layer 4022 may be formed by a deposition. A deposition thickness of the plug material layer 4022 may be greater than half of a thickness of the isolation gap (i.e., the thickness of the sacrificial layer), and less than half of a thickness of the protective gap (i.e., the channel defining layer). In addition, since the size of the processing channel is relatively large, the plug material layer 4022 may not fully fill the processing channel. ALD may be used to control the deposition thickness well. Considering the etching selectivity, the plug material layer 4022 may include, for example, an oxide.

Figure 28:
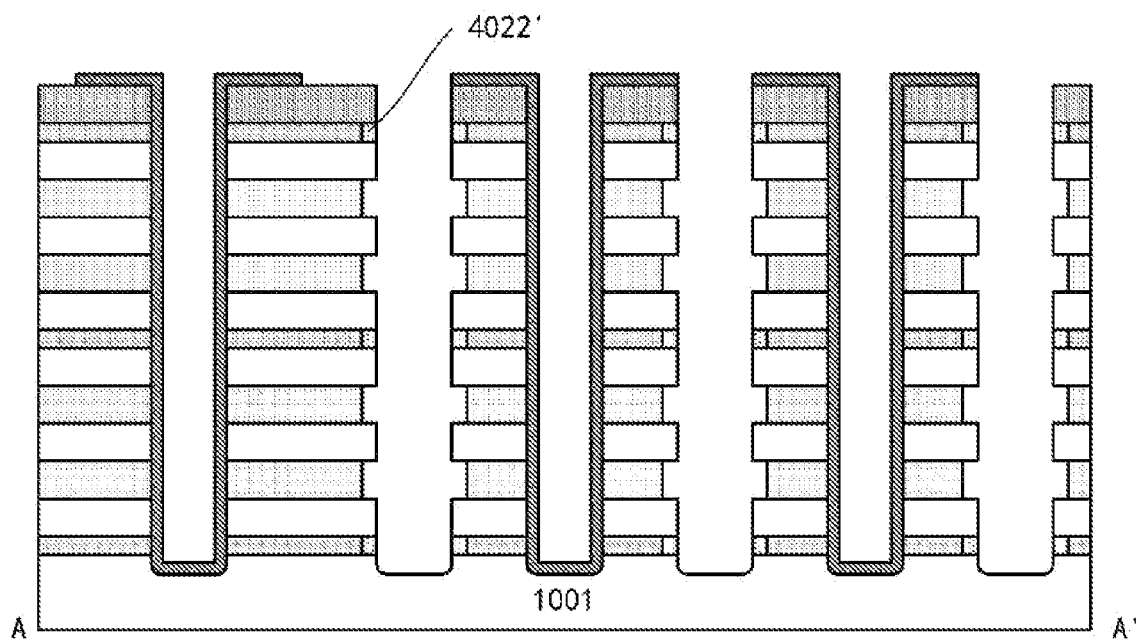

As shown in FIG. 28, a certain thickness of the plug material layer 4022 may be removed by a selective etching. For example, a removal thickness may be substantially equal to or slightly greater than the deposition thickness of the plug material layer 4022. Then, the plug material layer 4022 may be removed from the protective gap and left in the isolation gap, so as to form a filling plug 4022'. ALE may be used to control the removal thickness well.

Figure 29:
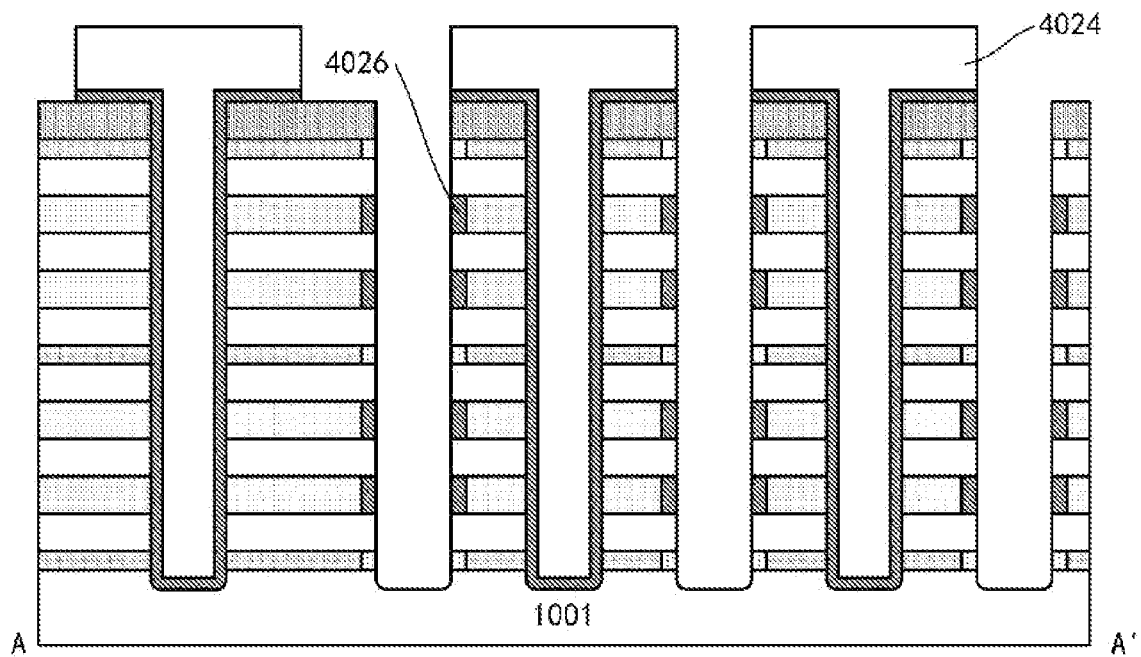

Next, a protective plug 4026 may be formed in the protective gap, as shown in FIG. 29. For example, the protective plug 4026 may be formed by deposition and then RIE in the vertical direction. Considering the etching selectivity (relative to the filling plug 4022' and the hard mask layer 1015), the protective plug 4026 may include, for example, SiC (which may be removed together with the support layer 1019 including SiC in the subsequent process; the protective plug 4026 may include a material different from that of the support layer 1019, and may be removed by a separate etching in the subsequent step). When the etching is performed to form the protective plug 4026, a photoresist 4024 may be used to cover the support layer 1019 to prevent the support layer 1019 from being removed. After that, the photoresist 4024 may be removed.

Figure 30:
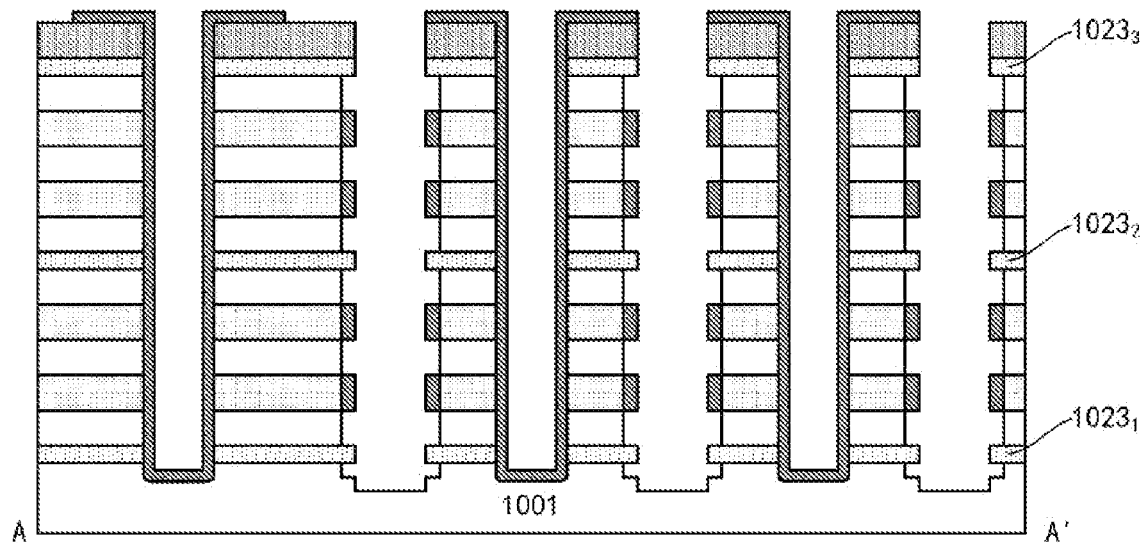

As shown in FIG. 30, the filling plug 4022' may be removed by a selective etching via the processing channel T, so as to expose the sacrificial layers $1003_1$, $1003_2$ and $1003_3$, and the exposed sacrificial layers $1003_1$, $1003_2$ and $1003_3$ may be removed by a selective etching, so as to be replaced by the isolation layers $1023_1$, $1023_2$ and $1023_3$.

In the above example, in order to form the protective plug 4026, the filling plug 4022' is formed firstly. However, the present disclosure is not limited to this. For example, the thickness of the channel defining layer may be less than the thickness of the sacrificial layer. In this case, the protective plug may be formed in the protective gap self-aligned to the channel defining layer according to the method of forming the filling plug 4022', so that a space of the isolation gap may be reserved. The sacrificial layer may be exposed by the isolation gap and thus may be replaced.

Since the channel defining layer is relatively recessed previously to form the self-aligned protective plug 4026, considering the subsequent semiconductor layer growth process and the isolation between the grown semiconductor layers, the source/drain defining layer may also be laterally recessed to a certain extent by a selective etching. The source/drain defining layer may be laterally recessed to substantially the same extent as the channel defining layer, so that they may have substantially coplanar sidewalls. Subsequently, the semiconductor layer may be grown on such substantially planar sidewalls.

After that, the support layer 1019 may be removed by a selective etching. The protective plug 4026 may also be removed while the support layer 1019 is removed.

Figure 31:
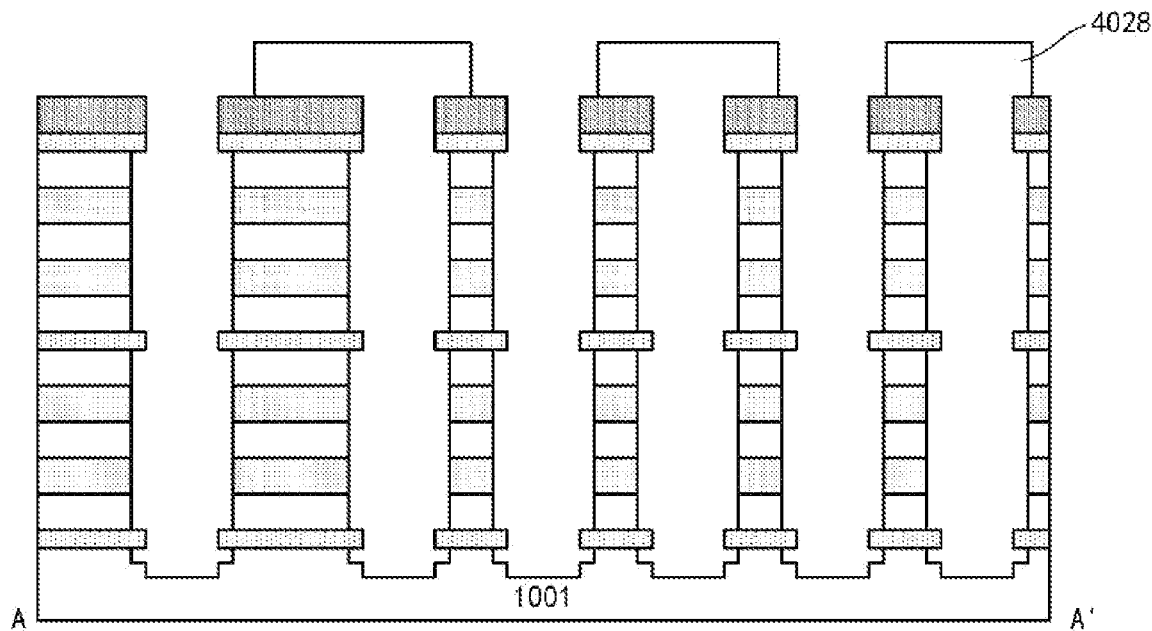

In the processing channel in which the support layer 1019 is not previously formed, the sidewall of the current device layer is laterally recessed to a certain extent relative to the sidewall of the opening in the hard mask layer 1015 due to the above treatment. In the processing channel in which the support layer 1019 is previously formed, the sidewall of the current device layer is consistent with the sidewall of the opening in the hard mask layer 1015. In consideration of the isolation between subsequently grown semiconductor layers, the sidewall of the device layer may also be laterally recessed to a certain extent in the processing channel in which the support layer 1019 is previously formed. The sidewall of the device layer in each processing channel may be laterally recessed to substantially the same extent. For example, as shown in FIG. 31, a photoresist 4028 may be formed and may be patterned to cover a processing channel in which the support layer 1019 is not previously formed and to expose a processing channel in which the support layer 1019 is previously formed. The device layer may be relatively recessed by a selective etching via these exposed processing channels. The selective etching of the channel defining layer and the selective etching of the source/drain defining layer in the device layer may be performed separately, and the etching depth thereof may be substantially the same. After that, the photoresist 4028 may be removed.

Figure 32:
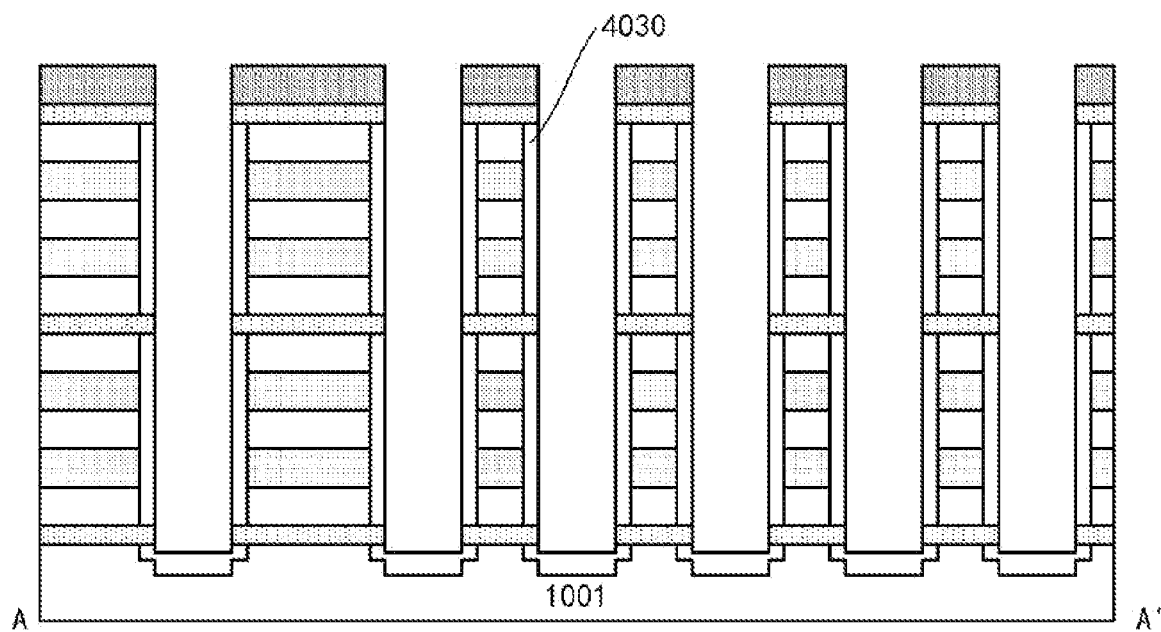

As shown in FIG. 32, a semiconductor layer 4030 may be formed on the sidewall of each of the device layers L1 and L2 by, for example, a selective epitaxial growth. The semiconductor layer 4030 may be formed as an annular nanosheet surrounding the processing channel, and may include various suitable semiconductor materials such as Si. The material and/or thickness of the semiconductor layer 4030 may be selected to improve the device performance. For example, the semiconductor layer 4030 may include Ge, an IV-IV group compound semiconductor such as SiGe, an III-V group compound semiconductor, etc. to improve a carrier mobility or reduce a leakage current. Semiconductor layers 4030 adjacent in the vertical direction may be isolated from each other by an isolation layer.

An annealing process may be performed to drive the dopant in the source/drain defining layer into the semiconductor layer 4030, so as to form a source/drain region in a portion of the semiconductor layer 4030 corresponding in height to the source/drain defining layer. Since the semiconductor layer 4030 is relatively thin, a process parameter such as an annealing time may be controlled so that a doping distribution in the semiconductor layer 4030 may be mainly affected by the lateral diffusion from the device layer but is substantially not affected or is slightly affected by a diffusion in the vertical direction. The channel defining layer may also be doped in-situ while being grown, so that a certain doping distribution may be formed in a portion of the semiconductor layer 4030 corresponding in height to the channel defining layer during the annealing process, so as to define the doping characteristic of the channel region. Alternatively, the semiconductor layer 4030 may be doped in-situ while being grown, so as to define the doping characteristic of the channel region. The doping of the channel region may improve the device performance such as improving the short channel effect, adjusting the threshold voltage (Vt), etc.

Figure 33:
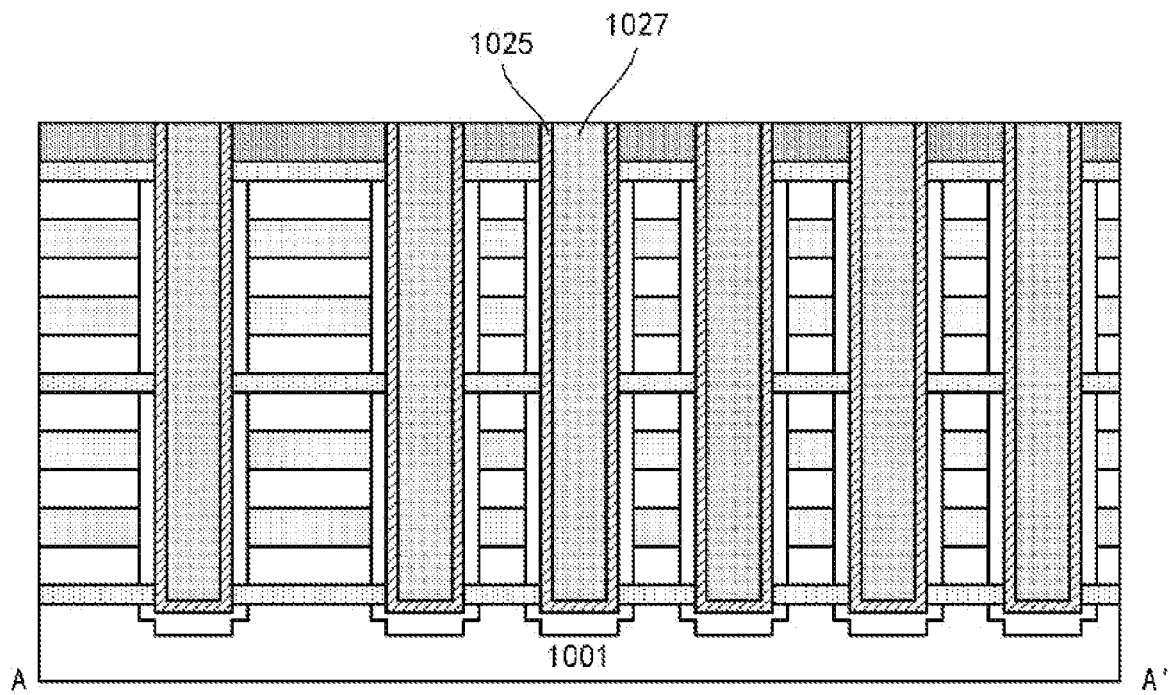

As shown in FIG. 33, a gate stack including the storage function layer 1025 and the gate conductor layer 1027 may be formed in the processing channel.

The channel defining layer may be removed so that the channel region may be completely formed in the semiconductor layer 4030. Then, a nanosheet device may be obtained.

Figure 34A:
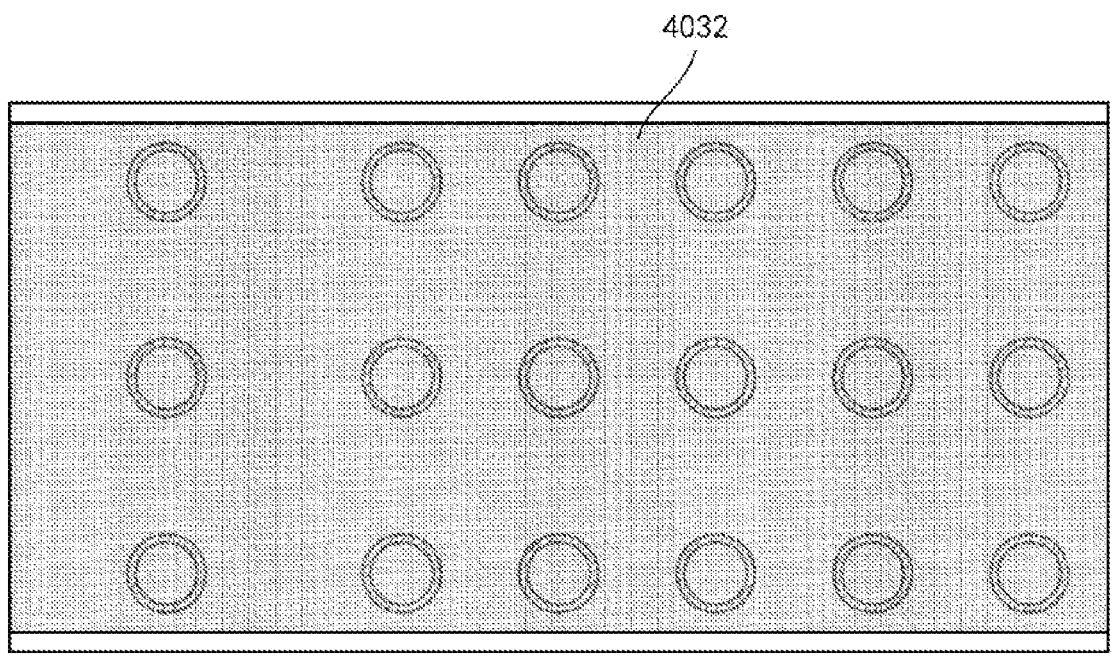
Figure 34B:
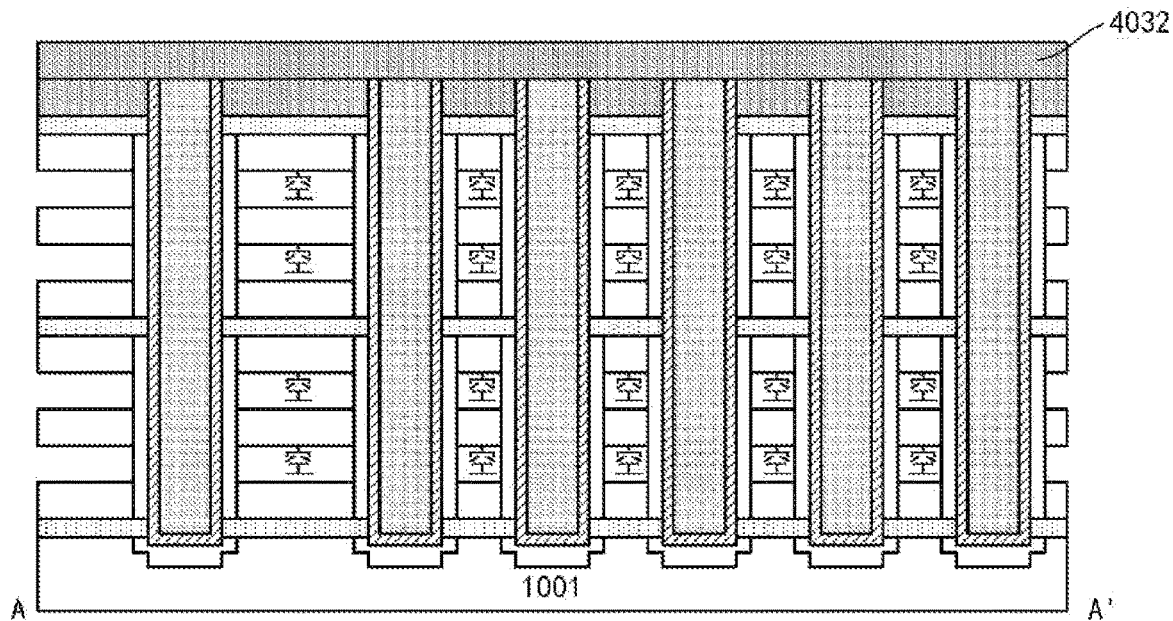

In order to remove the channel defining layer, it is necessary to form (additional) processing channel to each channel defining layer (the previous processing channels are occupied by the gate stack). For example, as shown in FIG. 34(*a*) and FIG. 34(*b*), a mask layer 4032 such as a nitride may be formed on the hard mask layer 1015 and may be patterned to expose a region in which a processing channel needs to be formed. The processing channel may be formed in a place where the gate stack is not arranged. In the examples of FIG. 34(*a*) and FIG. 34(*b*), a processing channel extending in a second direction (a horizontal direction on the paper plane of FIG. 34(*a*)) intersecting with (e.g., perpendicular to) a first direction (a vertical direction on the paper plane of FIG. 34(*a*)) may be arranged every several storage cells (three in the example of FIG. 34(*a*)) in the first direction. Using the photoresist 4032 as an etching mask, each layer under the photoresist 4032 may be etched by an anisotropic etching such as RIE in the vertical direction. The etching may proceed into the substrate 1001 to define the processing channel in which the channel defining layer is exposed. Each channel defining layer may be removed by a selective etching via the processing channel.

Figure 35:
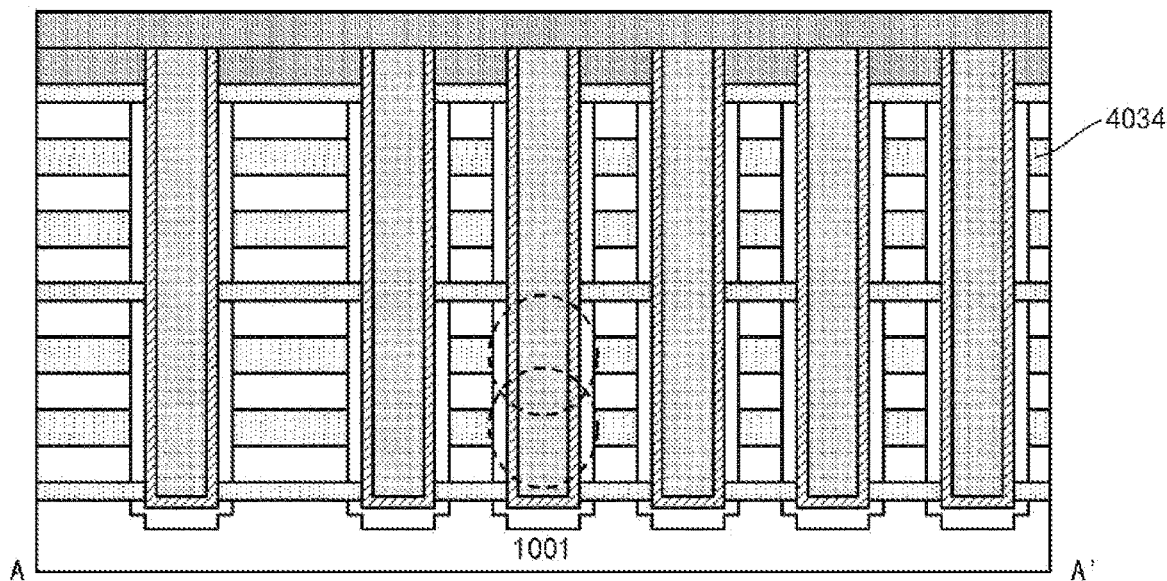

As shown in FIG. 35, a dielectric 4034 such as an oxide may be filled by a deposition in a gap left by the removal of the channel defining layer (and the processing channel), so as to achieve a structural support and an electrical isolation. A planarization process such as CMP may be performed on the deposited dielectric 4034.

As shown in FIG. 35, the gate stack (1025/1027) including the storage function layer is surrounded by the semiconductor layer 4030. The gate stack may cooperate with the semiconductor layer 4030 to define a storage cell, as shown by a dashed circle in FIG. 35. As described above, the semiconductor layer 4030 may form source/drain regions in portions corresponding to the source/drain defining layers at the upper and lower ends, and form a channel region in a portion corresponding to the channel defining layer in the middle. The channel region may connect the source/drain regions at opposite ends, and the channel region may be controlled by the gate stack.

The gate stack may extend in a pillar shape in the vertical direction and overlap a plurality of semiconductor layers, so as to define a plurality of storage cells stacked in the vertical direction. The storage cells associated with a single gate stack pillar may form a storage cell string. Corresponding to an arrangement of the gate stack pillar (corresponding to the arrangement of the processing channel T described above, e.g., a two-dimensional array), a plurality of such storage cell strings are arranged on the substrate to form a three-dimensional (3D) array of storage cells.

In this embodiment, a single gate stack pillar may define two storage cells in a single device layer, as shown by two dashed circles in the device layer L1 shown in FIG. 35. In the NOR-type storage device, the two storage cells may share a source/drain region (a portion of the semiconductor layer 4030 corresponding in height to the second source/ drain defining layer $1009_1$ or $1009_2$ in the middle), and may be electrically connected to the source line through the second source/drain defining layer $1009_1$ or $1009_2$. In addition, the other source/drain regions (portions of the semiconductor layer 4030 corresponding in height to the first source/drain defining layer $1005_1$ or $1005_2$ and the third source/drain defining layer $1013_1$ or $1013_2$) of the two storage cells may be electrically connected to different bit lines through the corresponding source/drain defining layers, respectively. That is, the source/drain defining layer may serve as an interconnection structure for electrically connecting the source/drain region of the storage cell to the bit line or the source line. The channel region is formed in the semiconductor layer 4030 in a form of an annular nanosheet, and therefore the device may be a nanosheet or nanowire device, so that the short channel effect may be controlled well and the power consumption may be reduced.

Next, the source line contact part may be fabricated.

Figure 36:
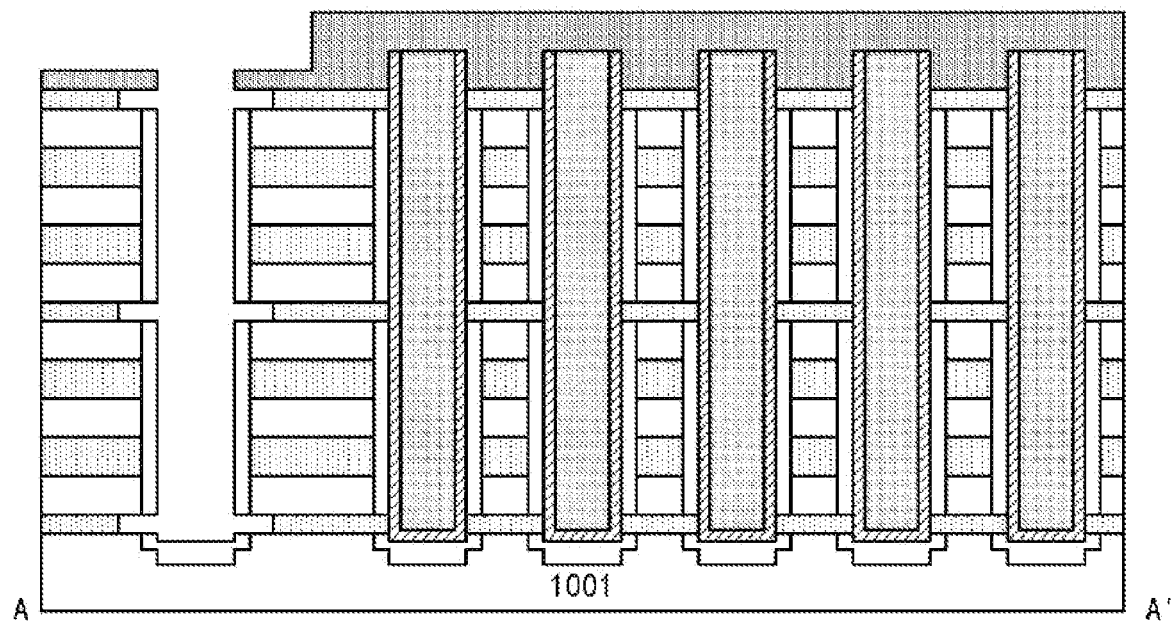

For example, as shown in FIG. 36, in the source line contact region, the gate stack may be removed to expose the processing channel. The isolation layers $1023_1$, $1023_2$ and $1023_3$ may be laterally recessed by a certain depth through a selective etching via the processing channel, which may refer to the description with reference to FIG. 7.

Figure 37:
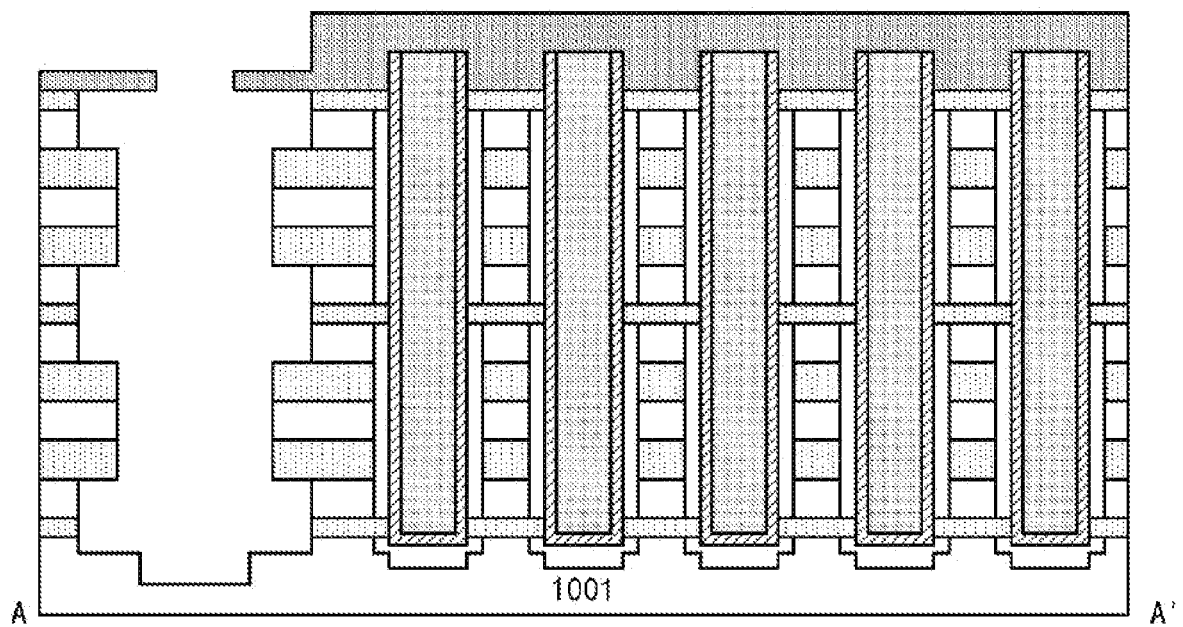
Figure 38:
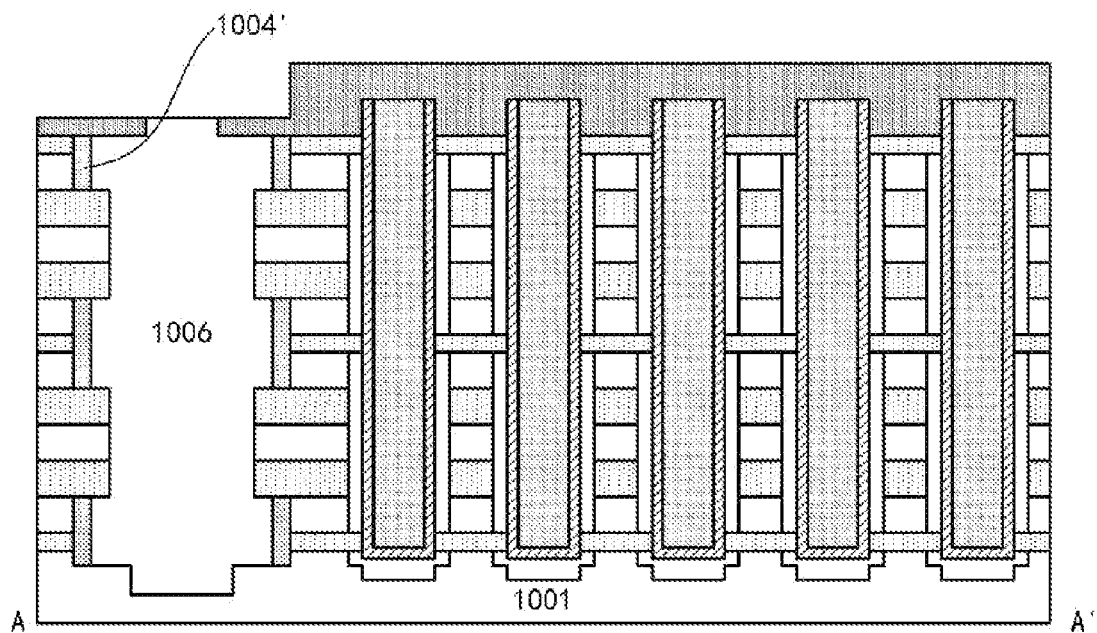

Then, the semiconductor layer 4030 and the first to third source/drain defining layers may be selectively etched. As described above with reference to FIG. 8 and FIG. 39, the first source/drain defining layer and the third source/drain defining layer may be laterally recessed relative to the second source/drain defining layer, as shown in FIG. 37. In the processing channel processed in such manner, the sidewall isolation layer 1004' and the source line contact part 1006 may be formed, as shown in FIG. 38.

According to the embodiments of the present disclosure, a three-dimensional (3D) NOR-type storage device may be constructed using a stack of single crystal material as a constructing block. Therefore, when a plurality of storage cells are stacked, an increase in resistance may be suppressed. In addition, an electrical connection to a source line may be achieved by a common source line contact part, which may save area and reduce manufacturing costs.

The storage device according to the embodiments of the present disclosure may be applied to various electronic apparatuses. For example, the storage device may store various programs, applications, and data required for the operation of the electronic apparatus. The electronic apparatus may further include a processor in cooperation with the storage device. For example, the processor may operate the electronic apparatus by executing a program stored in the storage device. The electronic apparatus may include, for example, a smart phone, a personal computer (PC), a tablet computer, an artificial intelligence device, a wearable device, a mobile power supply, or the like.

In the above description, the technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the measures in the various embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A NOR-type storage device, comprising:
   a gate stack extending vertically on a substrate, the gate stack comprising a gate conductor layer and a storage function layer;
   an active region surrounding a periphery of the gate stack,
      wherein the active region comprises a first source/drain region and a second source/drain region respectively located at different heights with respect to the substrate, and a first channel region located between the first source/drain region and the second source/drain region in a vertical direction,
      the active region further comprises a third source/drain region and a fourth source/drain region respectively located at different heights with respect to the substrate, and a second channel region located between the third source/drain region and the fourth source/drain region in the vertical direction,
      the storage function layer is arranged between the gate conductor layer and the active region, a first storage cell is defined at an intersection of the gate stack with the first source/drain region, the first channel region and the second source/drain region, and a second storage cell is defined at an intersection of the gate stack with the third source/drain region, the second channel region and the fourth source/drain region;
   a first interconnection layer, a second interconnection layer, a third interconnection layer, and a fourth interconnection layer extending laterally from the first source/drain region, the second source/drain region, the third source/drain region, and the fourth source/drain region, respectively; and
   a source line contact part extending vertically with respect to the substrate to pass through the first interconnection layer, the second interconnection layer, the third interconnection layer, and the fourth interconnection layer, wherein the source line contact part is electrically connected to one of the first interconnection layer and the second interconnection layer, and electrically connected to one of the third interconnection layer and the fourth interconnection layer.

2. The NOR-type storage device according to claim 1, wherein the first storage cell is adjacent to the second storage cell in the vertical direction, and the second interconnection layer is adjacent to the third interconnection layer in the vertical direction;
   wherein the first interconnection layer and the fourth interconnection layer are laterally recessed relative to the second interconnection layer and the third interconnection layer at the source line contact part;
   wherein the source line contact part is in contact with the second interconnection layer and the third interconnection layer; and
   wherein the NOR-type storage device further comprises a sidewall isolation layer arranged between the source line contact part and a sidewall of the first interconnection layer and between the source line contact part and a sidewall of the fourth interconnection layer.

3. The NOR-type storage device according to claim 2, wherein the active region is formed in a device layer, and the device layer has a doping distribution in the vertical direction so as to define the first source/drain region, the first channel region, the second source/drain region, the third source/drain region, the second channel region, and the fourth source/drain region;
  wherein the device layer extends laterally to form the first interconnection layer, the second interconnection layer, the third interconnection layer, and the fourth interconnection layer; and
  wherein the second source/drain region and the third source/drain region are integrated, and the second interconnection layer and the third interconnection layer are integrated.

4. The NOR-type storage device according to claim 3, comprising:
  a plurality of active regions; and
  an isolation layer arranged between the active regions adjacent in the vertical direction.

5. The NOR-type storage device according claim 3, wherein the source line contact part is further in contact with a region, in the device layer, corresponding to the first channel region and the second channel region.

6. The NOR-type storage device according to claim 5, further comprising:
  a highly doped region located on a lateral surface of a portion in the region, in the device layer, corresponding to the first channel region and the second channel region,
  wherein the highly doped region is adjacent to the sidewall isolation layer, and a doping concentration in the highly doped region is greater than that in at least a remaining portion in the region, in the device layer, corresponding to the first channel region and the second channel region.

7. The NOR-type storage device according to claim 2, wherein the active region is formed in a first device layer and a second device layer adjacent in the vertical direction, the first device layer has a doping distribution in the vertical direction to define the first source/drain region, the first channel region and the second source/drain region, and the second device layer has a doping distribution in the vertical direction to define the third source/drain region, the second channel region and the fourth source/drain region; and
  wherein the first device layer extends laterally to form the first interconnection layer and the second interconnection layer, and the second device layer extends laterally to form the third interconnection layer and the fourth interconnection layer.

8. The NOR-type storage device according to claim 7, further comprising:
  a first isolation layer arranged between the first device layer and the second device layer; and
  a second isolation layer arranged on a side of the first device layer opposite to the first isolation layer and on a side of the second device layer opposite to the first isolation layer,
  wherein the first isolation layer has a thickness different from that of the second isolation layer.

9. The NOR-type storage device according to claim 8, wherein the first isolation layer and the second isolation layer comprise the same dopant as the first source/drain region, the second source/drain region, the third source/drain region, and the fourth source/drain region.

10. The NOR-type storage device according to claim 7, further comprising:
  a conductive layer arranged between the first device layer and the second device layer; and an isolation layer arranged on a side of the first device layer opposite to the conductive layer and on a side of the second device layer opposite to the conductive layer.

11. The NOR-type storage device according to claim 7, wherein the source line contact part is further in contact with a region, in the first device layer, corresponding to the first channel region and a region, in the second device layer, corresponding to the second channel region.

12. The NOR-type storage device according to claim 11, further comprising:
  a highly doped region on a lateral surface of a portion in the region, in the first device layer, corresponding to the first channel region, wherein the highly doped region is adjacent to the sidewall isolation layer, and a doping concentration in the highly doped region is greater than that in at least a remaining portion of the region, in the first device layer, corresponding to the first channel region; and
  a highly doped region on a lateral surface of a portion in the region, in the second device layer, corresponding to the second channel region, wherein the highly doped region is adjacent to the sidewall isolation layer, and a doping concentration in the highly doped region is greater than that in at least a remaining portion of the region, in the second device layer, corresponding to the second channel region.

13. The NOR-type storage device according to claim 2, wherein the active region is formed in a semiconductor layer extending along a sidewall of the gate stack, the semiconductor layer has a doping distribution in the vertical direction to define the first source/drain region, the first channel region, the second source/drain region, the third source/drain region, the second channel region, and the fourth source/drain region;
  wherein the second source/drain region and the third source/drain region are integrated, and the second interconnection layer and the third interconnection layer are integrated; and
  wherein the first interconnection layer, the integrated second and third interconnection layers, and the fourth interconnection layer extend laterally and surround the semiconductor layer.

14. The NOR-type storage device according to claim 13, further comprising:
  a dielectric arranged among the first interconnection layer, the integrated second and third interconnection layers, and the fourth interconnection layer.

15. The NOR-type storage device according to claim 1, comprising:
  a plurality of active regions, wherein the source line contact part is electrically connected to a plurality of storage cells corresponding to the plurality of active regions.

16. The NOR-type storage device according to claim 1, wherein the storage function layer comprises at least one of a charge trapping material or a ferroelectric material.

17. The NOR-type storage device according to claim 1, wherein the active region comprises a single crystal semiconductor material.

18. The NOR-type storage device according to claim 1, wherein the storage function layer is formed on a bottom surface of the gate conductor layer and a sidewall of the gate conductor layer.

19. An electronic apparatus, comprising the NOR-type storage device according to claim 1.

20. The electronic apparatus according to claim 19, wherein the electronic apparatus comprises a smart phone, a personal computer, a tablet computer, an artificial intelligence device, a wearable device, or a mobile power supply.

* * * * *